US012720853B2

(12) United States Patent
Kang et al.

(10) Patent No.: US 12,720,853 B2
(45) Date of Patent: Aug. 25, 2026

(54) PLACEHOLDER WITH DIELECTRIC LINER PROTECTION TO PREVENT DIRECT BACKSIDE CONTACT (DBC) FROM SHORTING TO GATE

(71) Applicant: International Business Machines Corporation, Armonk, NY (US)

(72) Inventors: Tsung-Sheng Kang, Ballston Lake, NY (US); Tao Li, Slingerlands, NY (US); Ruilong Xie, Niskayuna, NY (US); Eric Miller, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 461 days.

(21) Appl. No.: 18/210,041

(22) Filed: Jun. 14, 2023

(65) Prior Publication Data

US 2024/0421085 A1 Dec. 19, 2024

(51) Int. Cl.

| | |
|---|---|
| ***H10D 84/83*** | (2025.01) |
| ***H10D 30/00*** | (2025.01) |
| ***H10D 30/01*** | (2025.01) |
| ***H10D 64/01*** | (2025.01) |
| ***H10D 64/23*** | (2025.01) |
| ***H10D 84/01*** | (2026.01) |

(Continued)

(52) U.S. Cl.

CPC ..... *H10D 84/8312* (2025.01); *H10D 30/0198* (2025.01); *H10D 30/501* (2025.01); *H10D 64/017* (2025.01); *H10D 64/2565* (2025.01); *H10D 84/0133* (2025.01); *H10D 84/0149* (2025.01); *H10D 84/0151* (2025.01); *H10D 84/83125* (2025.01); *H10D 84/832* (2025.01); *H10W 20/069* (2026.01); *H10W 20/427* (2026.01)

(58) Field of Classification Search

CPC ........... H10D 84/8312; H10D 30/0198; H10D 30/501; H10D 64/017; H10D 84/0133; H10D 84/0149; H10D 84/0151; H10D 84/83125; H10D 84/832; H10D 64/2565; H10D 30/6757; H01L 21/76897; H01L 23/5286; H01L 29/0673; H01L 29/401; H01L 29/41733; H01L 29/42392; H01L 29/66439; H01L 29/66545; H01L 29/775; B82Y 10/00

See application file for complete search history.

(56) References Cited

U.S. PATENT DOCUMENTS

| | | | | |
|---|---|---|---|---|
| 10,797,139 | B2 | 10/2020 | Morrow | |
| 11,615,987 | B2 * | 3/2023 | Huang | H01L 21/76897 257/401 |
| 12,068,200 | B2 * | 8/2024 | Huang | H10D 30/6757 |

(Continued)

*Primary Examiner* — Earl N Taylor

(74) *Attorney, Agent, or Firm* — Seed Intellectual Property Law Group LLP

(57) ABSTRACT

A semiconductor structure includes a plurality of gate-all-around field effect transistors. Each of the gate-all-around field effect transistors includes first and second source-drain regions; at least one channel region interconnecting the first and second source-drain regions; and a gate structure surrounding the at least one channel region. A direct backside contact is located below one of the first and second source-drain regions. The direct backside contact has an upper portion. A dielectric liner is wrapped around the upper portion of the direct backside contact.

16 Claims, 26 Drawing Sheets

X Y1

(51) Int. Cl.
*H10W 20/00* (2026.01)
*H10W 20/41* (2026.01)

(56) References Cited

U.S. PATENT DOCUMENTS

| | | | | |
|---|---|---|---|---|
| 12,464,806 | B2 * | 11/2025 | Huang | H10D 30/6735 |
| 2021/0111115 | A1 | 4/2021 | Morrow et al. | |
| 2021/0134721 | A1 | 5/2021 | Chiang et al. | |
| 2021/0202385 | A1 | 7/2021 | Huang et al. | |
| 2021/0305252 | A1 | 9/2021 | Chiang et al. | |
| 2021/0305381 | A1 | 9/2021 | Chiang et al. | |
| 2021/0351303 | A1 | 11/2021 | Ju et al. | |
| 2021/0376071 | A1 | 12/2021 | Liu et al. | |
| 2021/0376093 | A1 | 12/2021 | Chu et al. | |
| 2021/0408247 | A1 * | 12/2021 | Yu | H01L 21/02236 |
| 2022/0310455 | A1 * | 9/2022 | Huang | H10D 64/017 |
| 2023/0067804 | A1 | 3/2023 | Shen et al. | |
| 2023/0238284 | A1 * | 7/2023 | Huang | H10D 64/254 257/401 |
| 2024/0363428 | A1 * | 10/2024 | Huang | H10D 30/43 |
| 2024/0363617 | A1 * | 10/2024 | Hook | H10D 89/611 |
| 2024/0379769 | A1 * | 11/2024 | Xie | H10D 30/6729 |
| 2024/0420960 | A1 * | 12/2024 | Xie | H10D 30/6757 |
| 2024/0421003 | A1 * | 12/2024 | Kang | H01L 21/76897 |
| 2024/0421216 | A1 * | 12/2024 | Han | H10D 84/832 |

* cited by examiner

X1

Y1

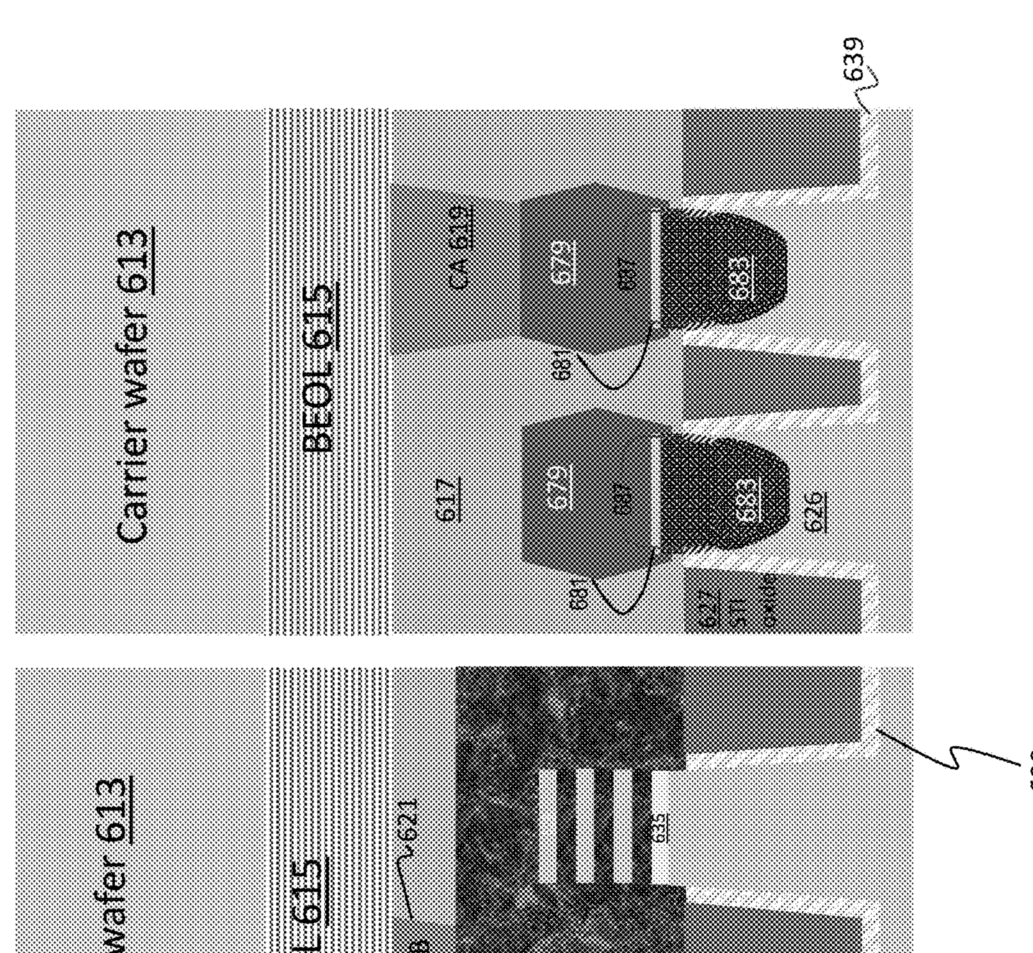
FIG. 16C
FIG. 16B
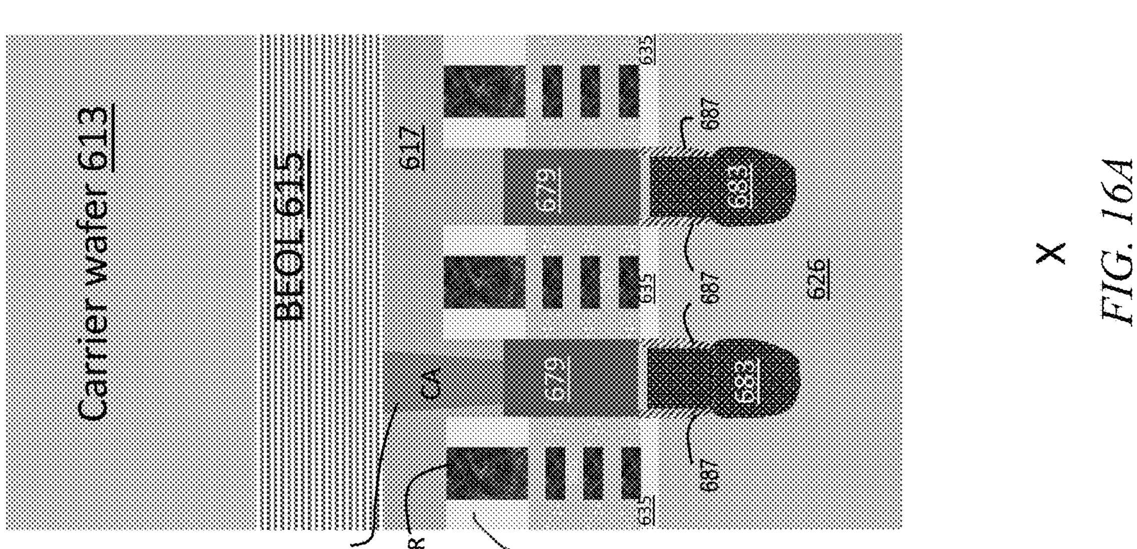
FIG. 16A

X

Y1

Y2

PLACEHOLDER WITH DIELECTRIC LINER PROTECTION TO PREVENT DIRECT BACKSIDE CONTACT (DBC) FROM SHORTING TO GATE

BACKGROUND

The present invention relates generally to the electrical, electronic and computer arts and, more particularly, to techniques for preventing backside contacts shorting to gates in nanosheet field effect transistors (FETs) and the like.

Buried power rails (BPR) and backside power distribution networks (BSPDN) are very attractive schemes for future complementary metal oxide semiconductor (CMOS) scaling. However, with continued scaling, a problem has arisen with regard to shorting between backside contacts and transistor gates.

FIG. 1 is a top view of aspects of a prior art integrated circuit structure. The upper fin (stack of one or more nanosheets) 301 is for a first FET FET1 (e.g., an NFET or PFET) and the lower fin (stack of one or more nanosheets) 303 is for a second FET FET2 (e.g., a PFET or NFET). Note the three gates 305, 307, 309 each with gate spacers 311. Note that the gates in the top view are generally representative of both the dummy gates used during fabrication and the high-K metal gate stacks (HKMG) in the final structure. FIG. 2A is a cross-gate view of the device of FIG. 1 along line X1 while FIG. 2B is a cross-fin view of the device of FIG. 1 along line Y1. The structures in FIG. 2A and FIG. 2B are known intermediate structures in the fabrication of CMOS structures with BPR and BSPDN. Note the carrier wafer 313, back end of line (BEOL) wiring 315, backside interlayer dielectric (BILD) 325, organic planarization layer (OPL) 323, topside interlayer dielectric (ILD) 317, source/drain contact 319, gate contact 321, nanosheets 329, epitaxially grown source/drain regions 333, backside contact cavities 337 prepared by reactive ion etching (RIE), bottom dielectric isolation (BDI) 335, inner spacers 331, shallow trench isolation (STI) oxide 327, STI liner 339, SiGe placeholders 341L and 341R, and SiGe placeholder buffer Si 343L and 343R. FIGS. 2A and 2B thus depict a known intermediate structure after backside contact reactive ion etching. The gates 305, 307, 309 are high-K metal gate stacks (HKMG) as are known to the skilled artisan. The BEOL wiring 315 is depicted at a high level; the skilled person is familiar with the details of a BEOL wiring layer per se. Again, the skilled artisan will be familiar with techniques for preparing such an intermediate structure, as discussed elsewhere herein.

In FIG. 1, note that the way the nanosheets are arranged is typically NNPPNNPP, such that FET1 and FET2 can, in general, be N next to P, P next to N, P next to P, or N next to N.

FIGS. 3A and 3B show the structure of FIGS. 2A and 2B after removal of the SiGe placeholder 341R. As can be seen at 345, BILD 325 experiences some oxide loss during removal of the SiGe placeholder 341R. In particular, as seen at 345, the oxide loss results in pushing the side boundary of the BILD 325 to a point below the inner spacer 331 near the gate 307.

FIGS. 4A and 4B show the structure of FIGS. 3A and 3B after pre-silicide cleaning, which cleaning causes additional oxide loss as seen at 347 further pushing the side boundary of the BILD 325 to a point below the gate 307. Note the cross section view in FIG. 4B along line Y1. FIGS. 5A and 5B show the structure of FIGS. 4A and 4B after backside contact metallization (contact metal designated as 351), note backside contact-to-gate short at 349. Generally, reliability issues can arise. For example, if the S/D backside contact 351 touches the gate metal, then it means the S/D and the gate are essentially a single object. The current will run into the gate and burn the gate metal away. The current from the S/D is many orders of magnitude higher than the tolerance of the gate metal, since the gate metal is usually a very thin strip. Because of this small dimension, all the electrons are "squeezed" and flow inside this thin strip, which induces high current density. This high current density can cause metal atom dislocation as the consequence of electron bombardment, and will eventually distort/burn the gate. Leakage into the gate metal also means that the gate voltage applied to the gate (sourced from the world (e.g., voltage supply) outside the chip) cannot be at the set point. The device will accordingly be out of control before the gate is burned.

BRIEF SUMMARY

Principles of the invention provide techniques for a placeholder with dielectric liner protection to prevent direct backside contacts (DBC) from shorting to gate. In one aspect, an exemplary semiconductor structure includes a plurality of gate-all-around field effect transistors. Each of the gate-all-around field effect transistors includes: first and second source-drain regions; at least one channel region interconnecting the first and second source-drain regions; and a gate structure surrounding the at least one channel region. A direct backside contact is located below one of the first and second source-drain regions. The direct backside contact has an upper portion. A dielectric liner is wrapped around the upper portion of the direct backside contact. One or more embodiments advantageously reduce or eliminate shorting of direct backside contacts to adjacent gates.

Optionally, bottom dielectric isolation is located below the gate structures; and backside interlayer dielectric (BILD) is located below the plurality of gate-all-around field effect transistors. A portion of the backside interlayer dielectric (BILD) includes protector backside interlayer dielectric (BILD) between a corresponding one of the gate structures and the direct backside contact. The dielectric liner is between the upper portion of the direct backside contact and the bottom dielectric isolation (BDI). Advantageously, the protector BILD reduces or eliminates the chances of the gate directly touching the source-drain regions.

In another aspect, another exemplary semiconductor structure includes a plurality of gate-all-around field effect transistors. Each of the gate-all-around field effect transistors includes: first and second source-drain regions; at least one channel region interconnecting the first and second source-drain regions; and a gate structure surrounding the at least one channel region. A direct backside contact is located below one of the first and second source-drain regions. The direct backside contact has an upper portion. A placeholder structure is located below another one of the first and second source-drain regions. The placeholder structure has an upper portion. A dielectric liner is wrapped around the upper portion of the placeholder. One or more embodiments advantageously reduce or eliminate shorting of direct backside contacts to adjacent gates.

Optionally, backside interlayer dielectric (BILD) is located below the plurality of gate-all-around field effect transistors. A portion of the backside interlayer dielectric (BILD) comprises protector backside interlayer dielectric (BILD) between a corresponding one of the gate structures and the direct backside contact. Advantageously, the protector BILD reduces or eliminates the chances of the gate directly touching the source-drain regions.

In still a further aspect, an exemplary method of forming a semiconductor structure includes providing a starting structure including: a silicon substrate; an etch stop liner above the silicon substrate; an additional silicon substrate above the etch stop liner, the additional silicon substrate having a plurality of shallow trench isolation regions formed therein; bottom dielectric isolation (BDI) above the additional silicon substrate; and dummy gate stacks above the bottom dielectric isolation (BDI), the dummy gate stacks being separated by trenches. Further steps include etching through the bottom dielectric isolation (BDI) at the bottoms of the trenches to form shallow cavities; depositing liner material on the sides of the trenches and the shallow cavities and removing the liner material from the bottom of the shallow cavities; etching placeholder cavities at the bottom of the shallow cavities; growing placeholders in the placeholder cavities; epitaxially growing source-drain regions outward of the placeholders; and forming replacement metal gates between the source-drain regions, to replace the dummy gate stacks, forming middle-of-line contacts, forming back-end-of-line wiring, and bonding to a carrier wafer to obtain an intermediate structure. Still further steps include flipping the intermediate structure and removing the substrate, etch stop liner, and additional silicon substrate; filling backside interlayer dielectric and patterning same for backside contacts adjacent select ones of the placeholders; removing the select ones of the placeholders; and metallizing the backside contacts and forming buried power rails (BPR) and a backside power distribution network (BSPDN).

As used herein, "facilitating" an action includes performing the action, making the action easier, helping to carry the action out, or causing the action to be performed. Thus, by way of example and not limitation, instructions executing on a processor might facilitate an action carried out by semiconductor fabrication equipment, by sending appropriate data or commands to cause or aid the action to be performed. Where an actor facilitates an action by other than performing the action, the action is nevertheless performed by some entity or combination of entities.

Techniques as disclosed herein can provide substantial beneficial technical effects. Some embodiments may not have these potential advantages and these potential advantages are not necessarily required of all embodiments. By way of example only and without limitation, one or more embodiments may provide one or more of:

- Allow further scaling, enhanced yield, and/or enhanced reliability for semiconductor structures using buried power rails (BPR) and backside power distribution networks (BSPDN) by reducing or eliminating shorting of direct backside contacts to adjacent gates;
- Provide better and easier process control through use of a protective liner which allows for a much bigger process window.

These and other features and advantages will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein:

FIGS. 16A-16C are views of the semiconductor structure of FIGS. 15A-15C after etch stop layer removal, taken along lines X1, Y1, and Y2, respectively of FIG. 13;

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Principles of inventions described herein will be in the context of illustrative embodiments. Moreover, it will become apparent to those skilled in the art given the teachings herein that numerous modifications can be made to the embodiments shown that are within the scope of the claims. That is, no limitations with respect to the embodiments shown and described herein are intended or should be inferred.

Figure 1:
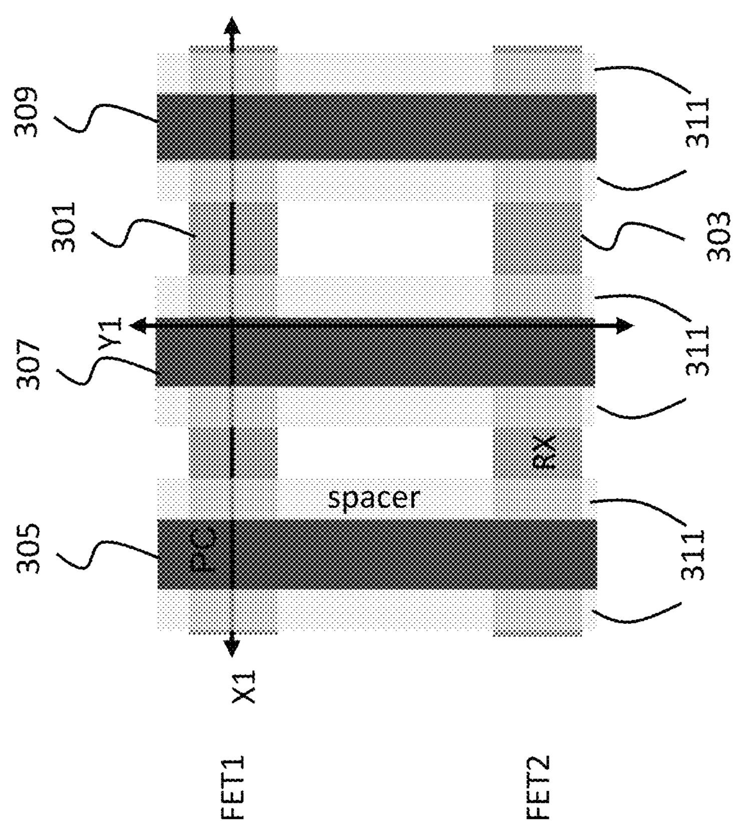
FIG. 1 is a top view of a semiconductor structure, in accordance with the prior art.
Figures 2A, 2B:
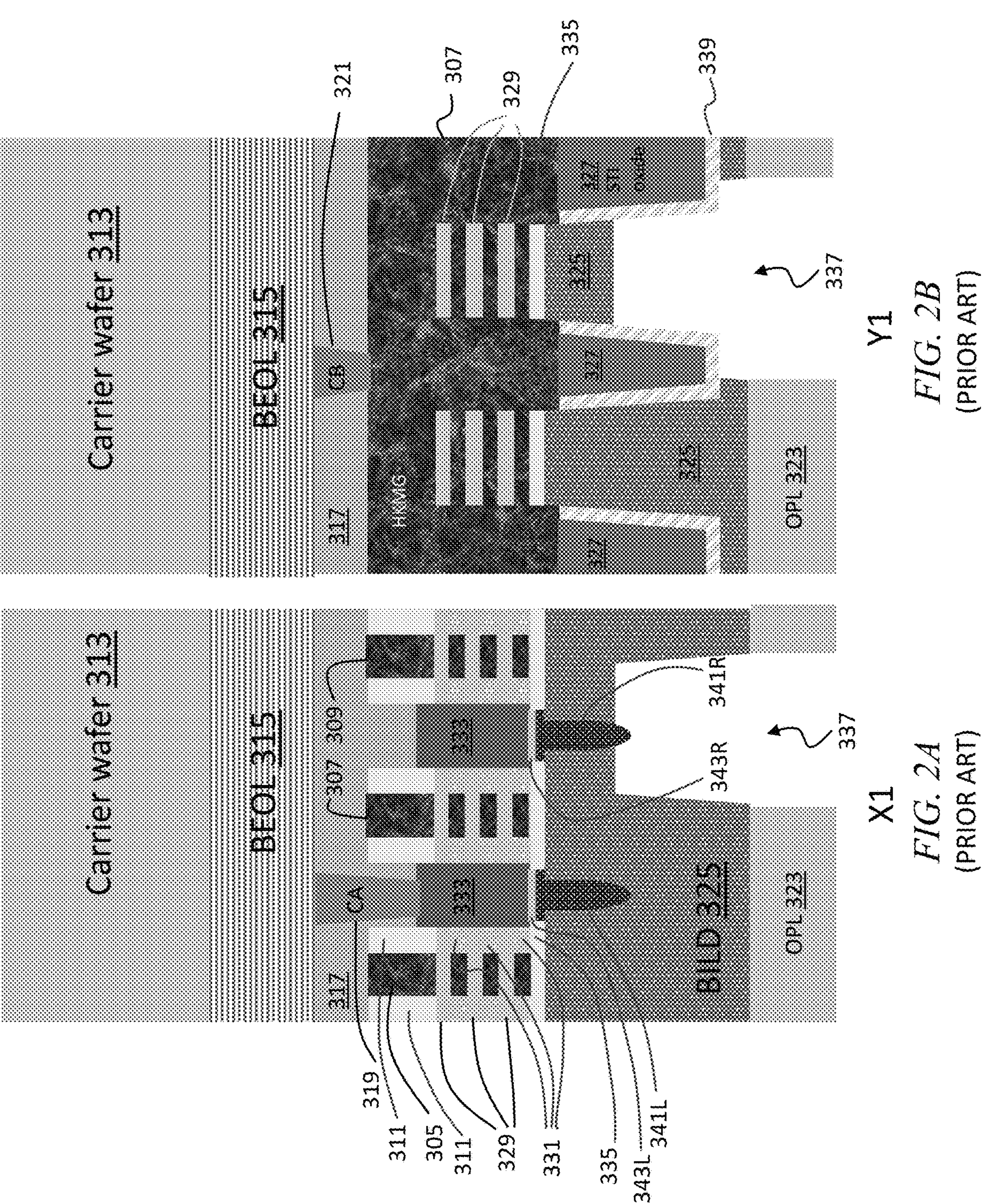
FIGS. 2A-2B are views of the prior art semiconductor structure of FIG. 1, taken along lines X1 and Y1 respectively of FIG. 1.
Figures 3A, 3B:
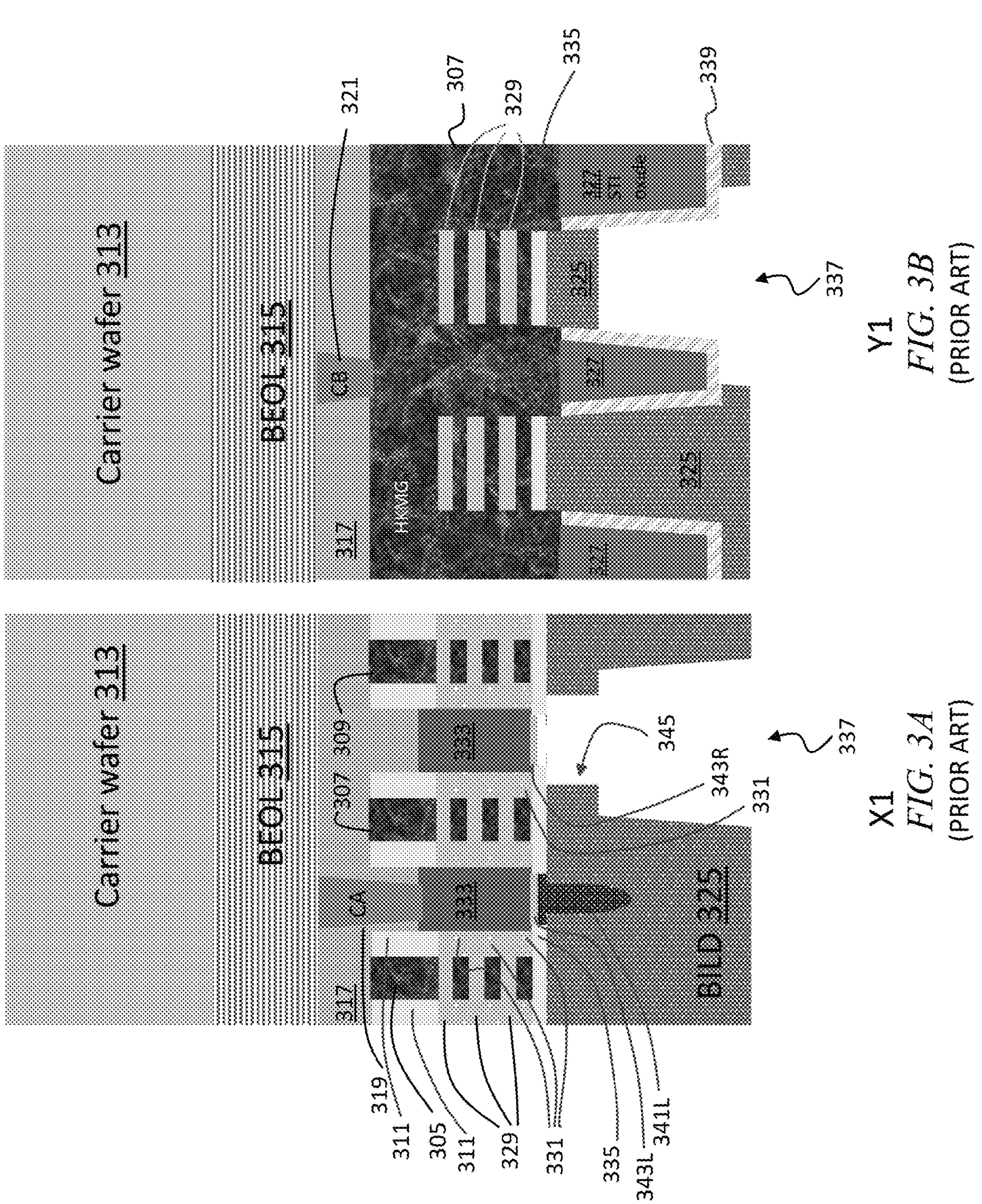
FIGS. 3A-3B are views of the prior art semiconductor structure of FIGS. 2A-2B after SiGe placeholder removal, taken along lines X1 and Y1 respectively of FIG. 1.
Figures 4A, 4B:
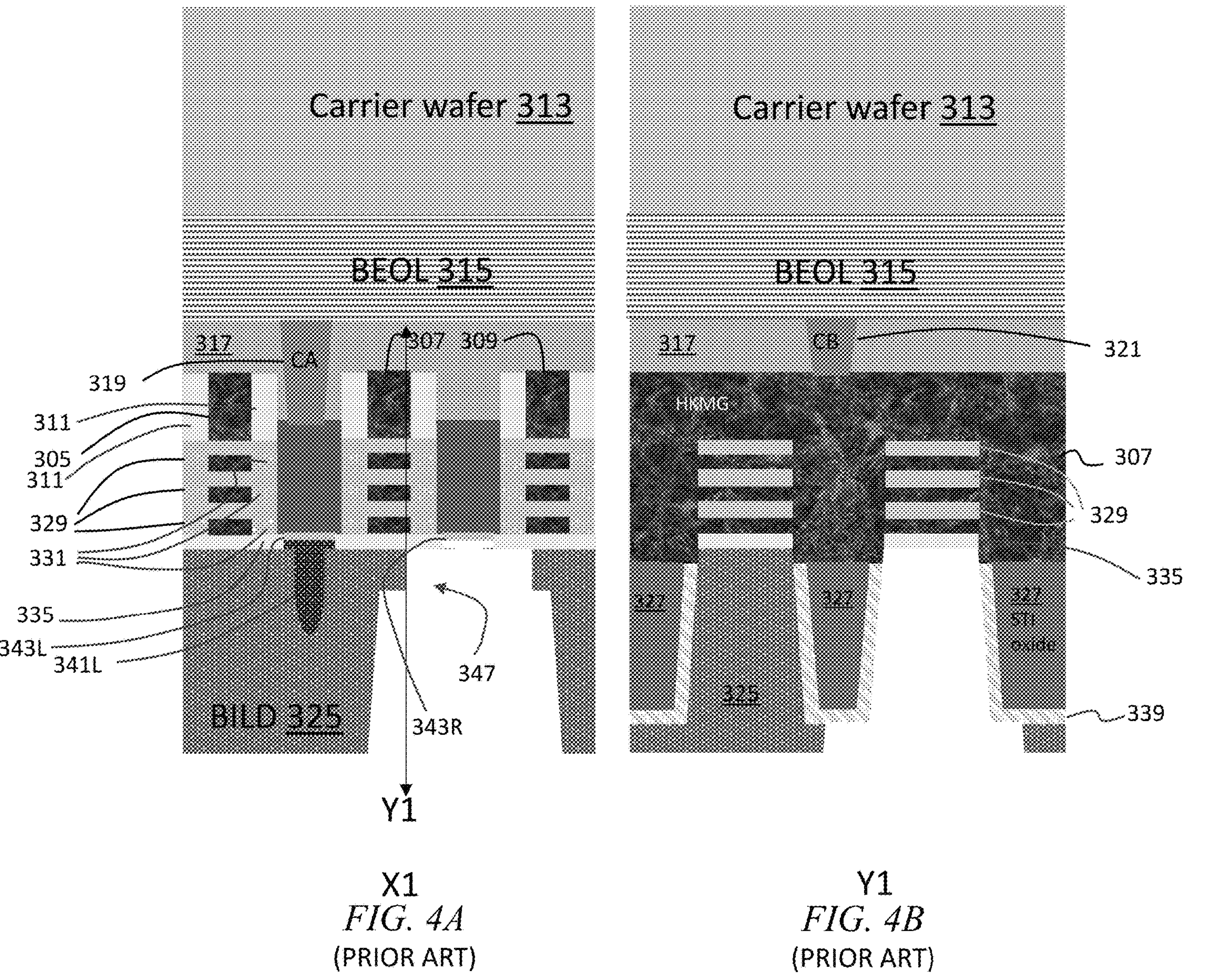
FIGS. 4A-4B are views of the prior art semiconductor structure of FIGS. 3A-3B after pre-silicide cleaning, taken along lines X1 and Y1 respectively of FIG. 1.
Figures 5A, 5B:
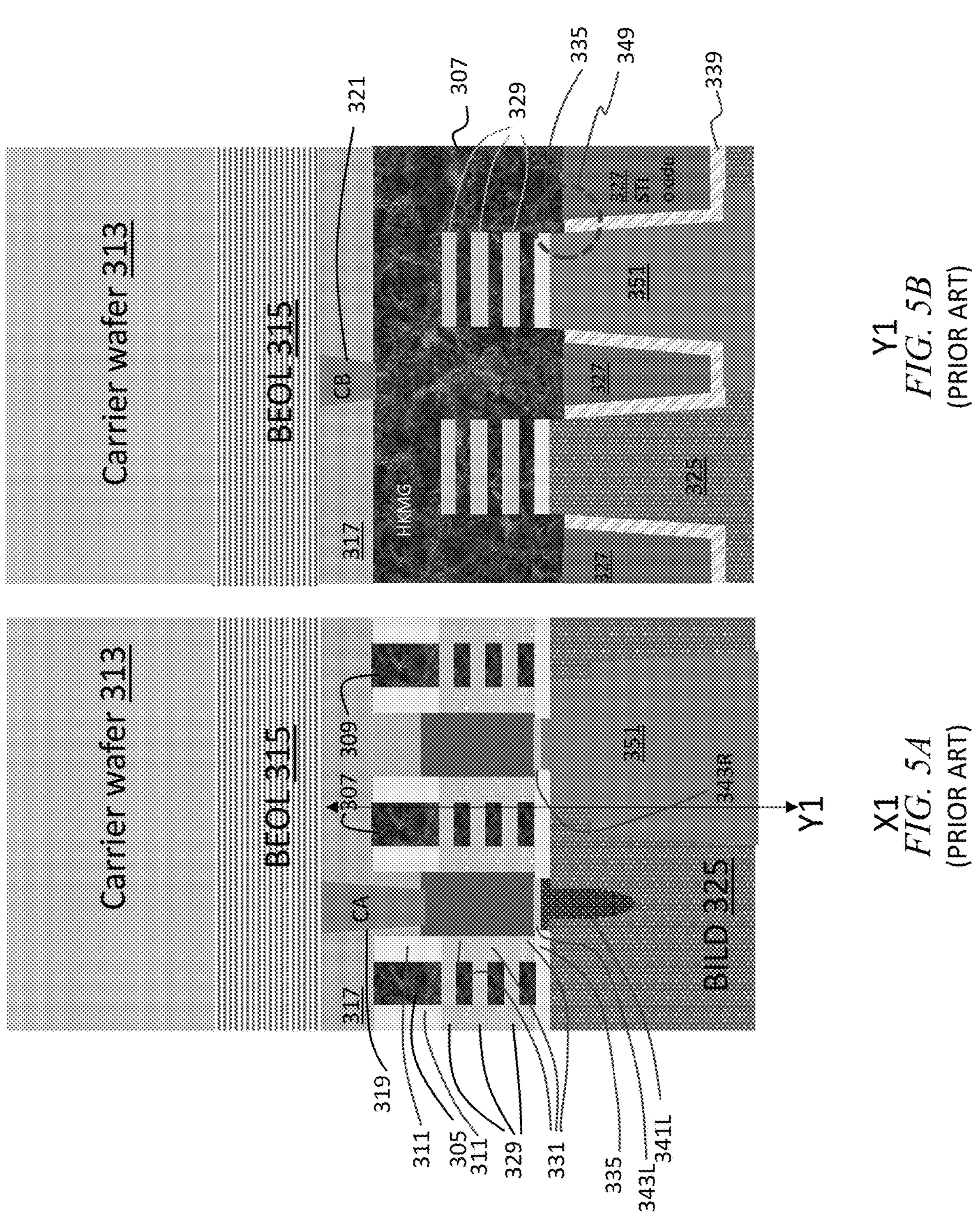
FIGS. 5A-5B are views of the prior art semiconductor structure of FIGS. 4A-4B after backside contact metallization, taken along lines X1 and Y1 respectively of FIG. 1.
Figure 6:
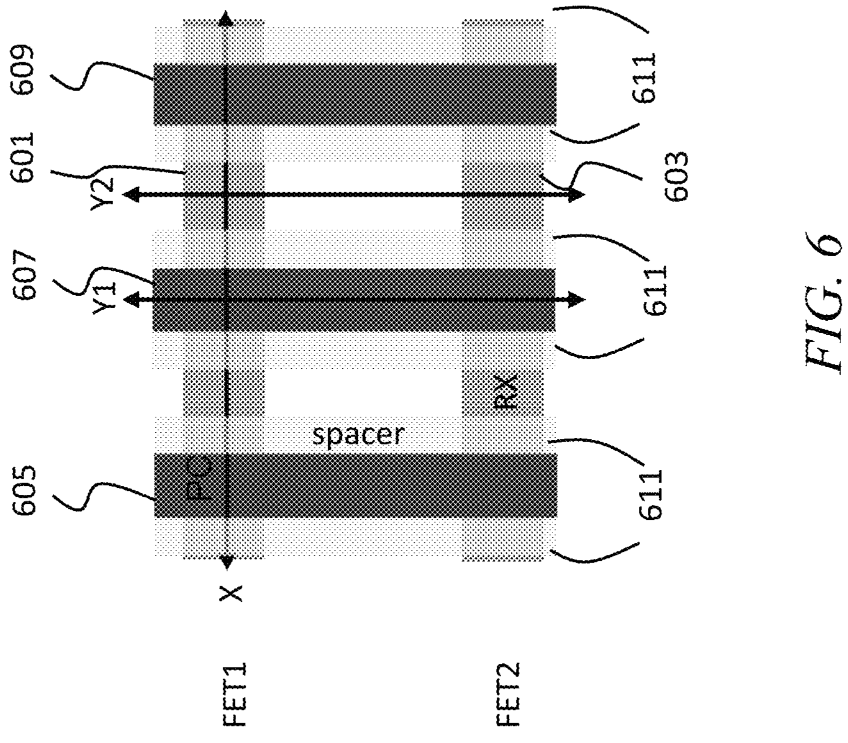
FIG. 6 is a top view of a semiconductor structure, in accordance with an aspect of the invention.
Figures 7A, 7B, 7C:
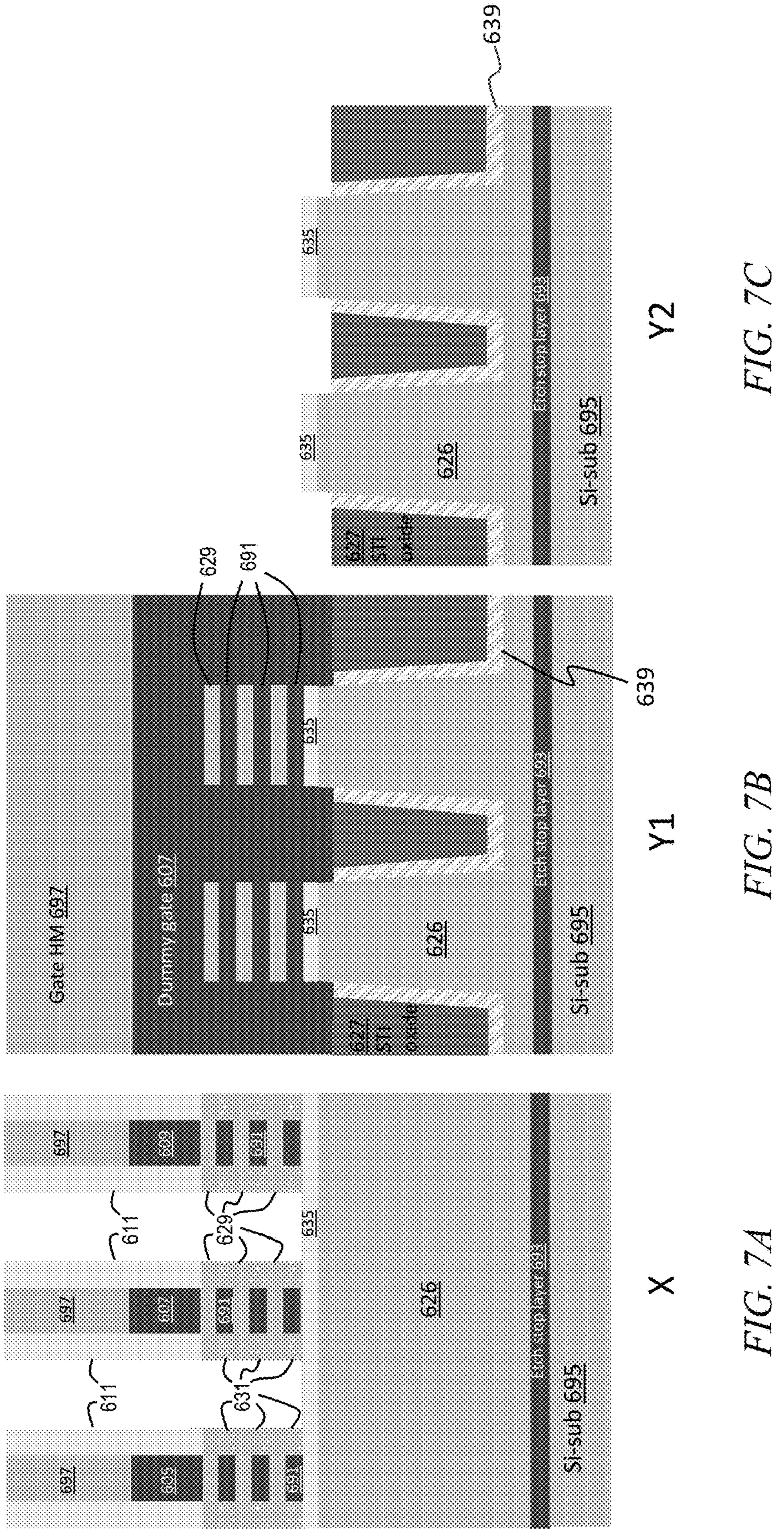
FIGS. 7A-7C are views of the semiconductor structure of FIG. 6, taken along lines X1, Y1, and Y2, respectively of FIG. 6.

Aspects of invention provide techniques for a placeholder with dielectric liner protection to prevent direct backside contacts (DBC) from shorting to gates. Referring now to FIGS. 6 and 7A-7C, consider an exemplary process flow. FIG. 6 is a top view of aspects of an integrated circuit structure in accordance with an exemplary embodiment. The upper fin (stack of one or more nanosheets) 601 is for a first FET FET1 (e.g., an NFET or PFET) and the lower fin (stack of one or more nanosheets) 603 is for a second FET HET2 (e.g., a PFET or NFET). In FIG. 6, note that the way the nanosheets are arranged can be, for example, NNPPNNPP, such that FET1 and FET2 can, in general, be N next to P, P next to N, P next to P, or N next to N. Note the three dummy gates 605, 607, 609 each with gate spacers 611. FIG. 7A is a cross-gate view of the device of FIG. 6 along line X in FIG. 6 while FIG. 7B is a cross-fin view of the device of FIG. 6 through gate 607 along line Y1 and FIG. 7C is a cross-fin view of the device of FIG. 6 between gates 607 and 609 (i.e., in the source/drain region region) along line Y2. The structure in FIGS. 6 and 7A-7C is a starting structure that can be made by the skilled artisan using known techniques given the teachings herein. Note gate hardmask 697, dummy gates 605, 607, 609, gate spacers 611, nanosheet channels 629, inner spacers 631, remaining sacrificial SiGe 691, STI oxide 627, silicon substrate 695, etch stop layer 693, STI liner 639, additional silicon substrate 626 on top of the etch stop layer 693, and bottom dielectric isolation (BDI) 635.

Figures 8A, 8B, 8C:
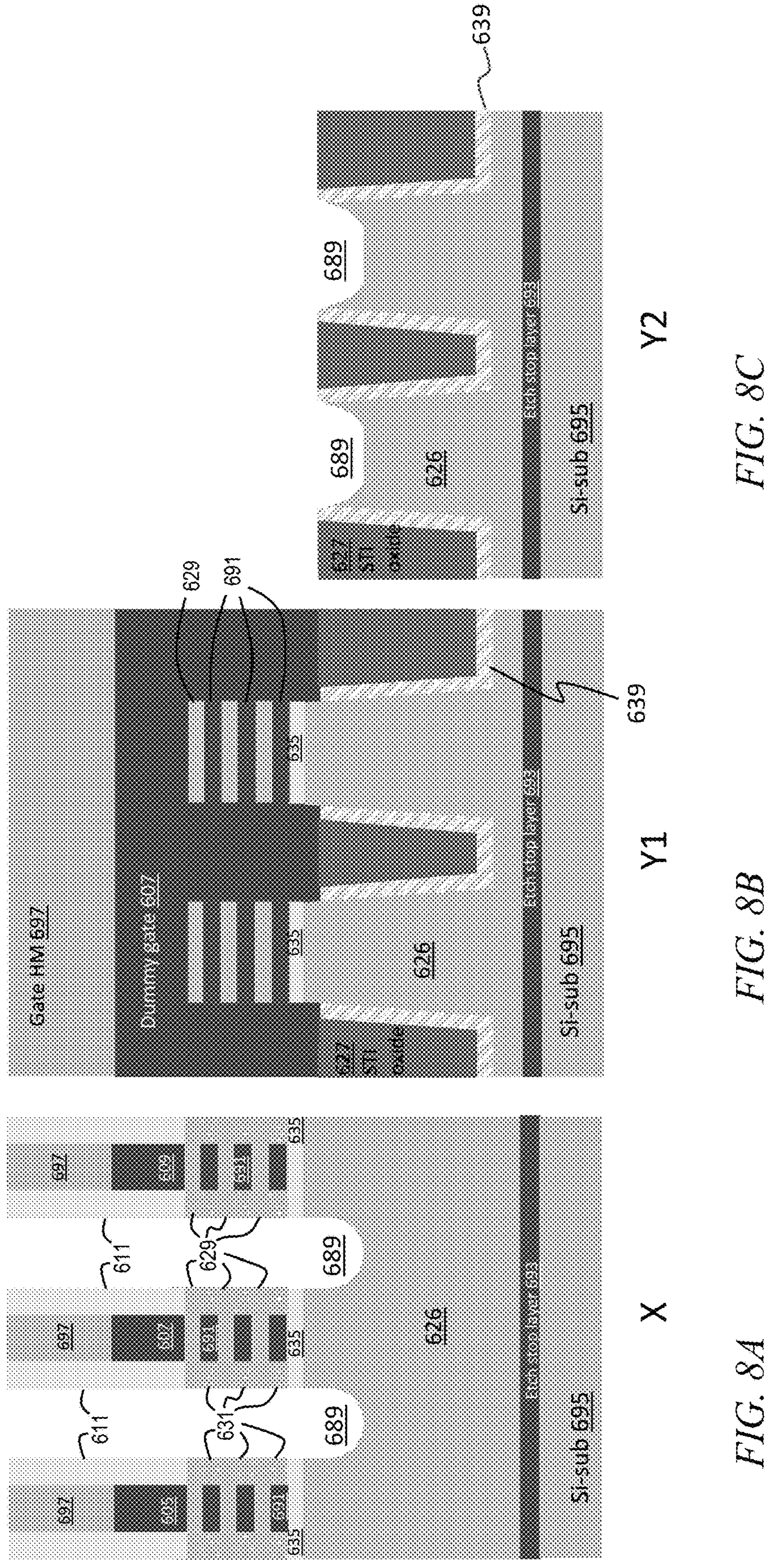
FIGS. 8A-8C are views of the semiconductor structure of FIGS. 7A-7C after bottom dielectric isolation breakthrough and shallow cavity etching, taken along lines X1, Y1, and Y2, respectively of FIG. 6.

FIGS. 8A-8C show views corresponding to FIGS. 7A-7C, after breaking through the BDI 635 and etching shallow cavities 689 into the additional silicon substrate 626, in accordance with aspects of the invention.

Figures 9A, 9B, 9C:
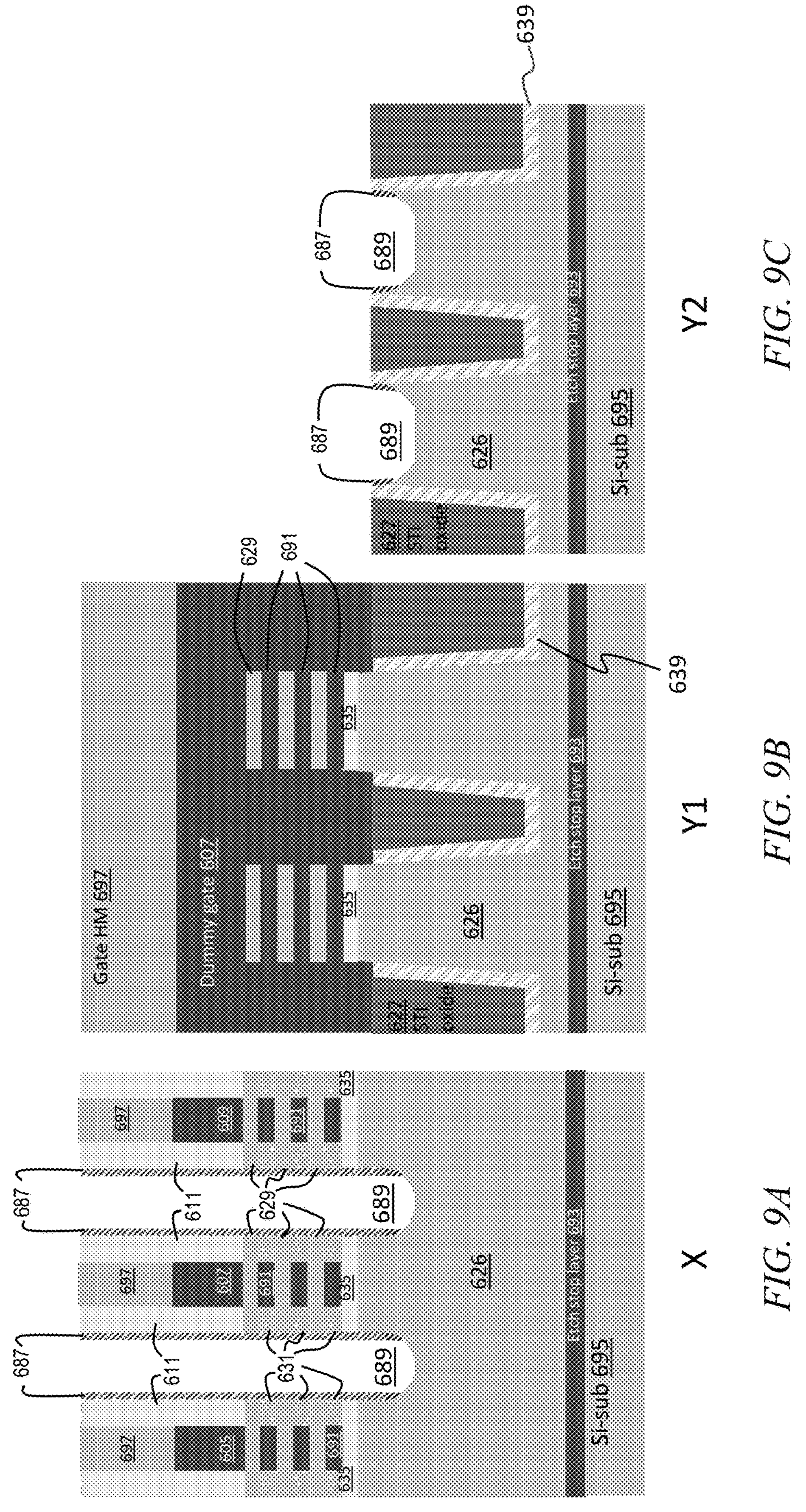
FIGS. 9A-9C are views of the semiconductor structure of FIGS. 8A-8C after liner deposition and breakthrough, taken along lines X1, Y1, and Y2, respectively of FIG. 6.

FIGS. 9A-9C show views corresponding to FIGS. 8A-8C, after depositing liner 687 and breaking through same at lower portions of the cavities 689 and at the upper horizontal surfaces in each view (i.e., liner 687 is deposited along all exposed surfaces and removed from the upper surfaces of 697, 611, 627, and 639 at the same time it is removed from the lower portions of the cavities 689). The shallow cavities 689 are thus protected by the liner 687 as shown. In the view of FIG. 9C, wrapping of the liner 687 in the other direction (i.e., view along line Y2) can be seen.

Figures 10A, 10B, 10C:
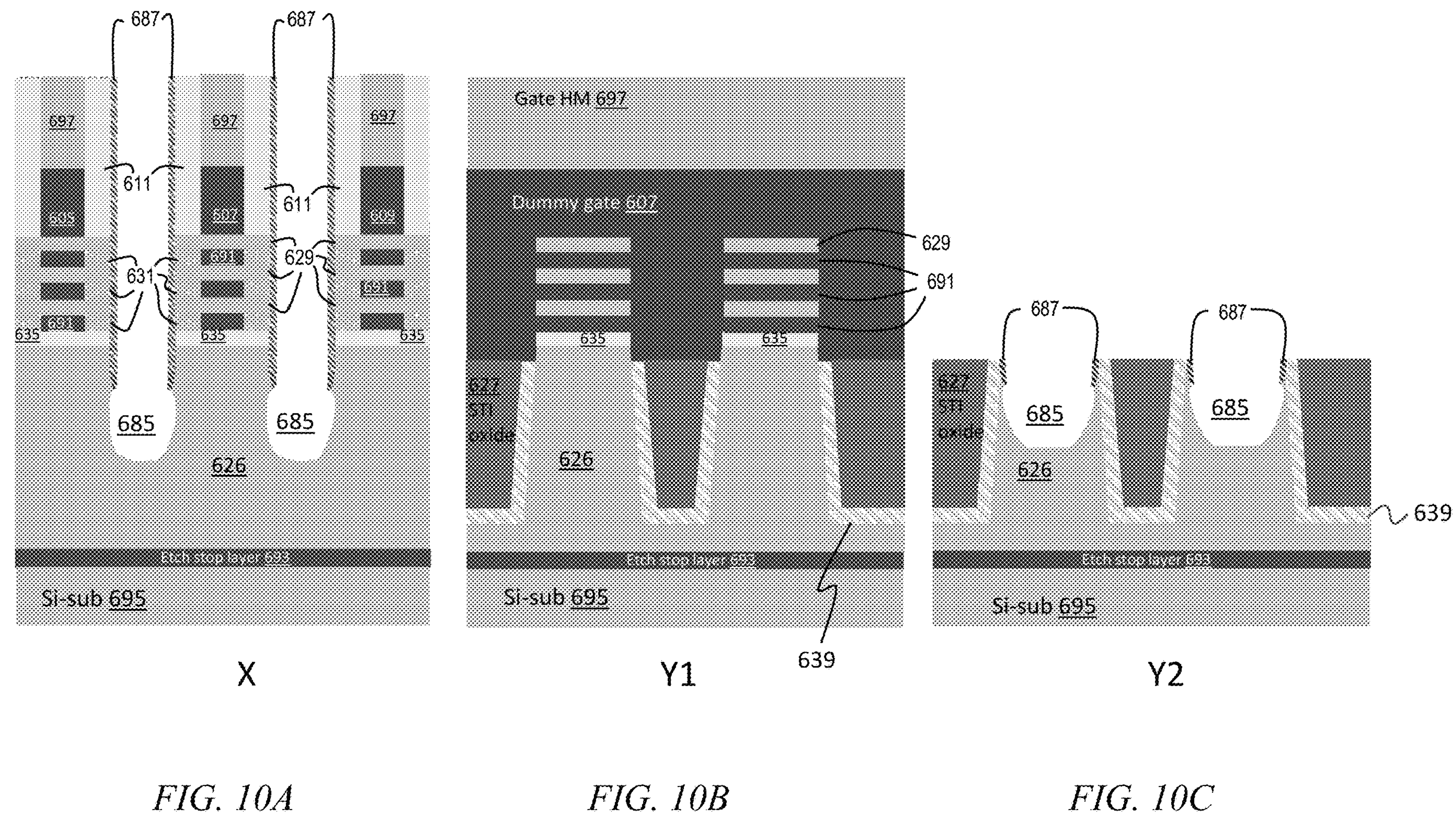
FIGS. 10A-10C are views of the semiconductor structure of FIGS. 9A-9C after placeholder cavity etching with lateral enlargement, taken along lines X1, Y1, and Y2, respectively of FIG. 6.

FIGS. 10A-10C show views corresponding to FIGS. 9A-9C, after etching placeholder cavities 685 with lateral enlargement at the bottoms of the cavities 689 of FIG. 9A-9C. Here, it is acceptable for the placeholder cavities 685 to enlarge laterally because they are located well below the bottom of the gates.

Figures 11A, 11B, 11C:
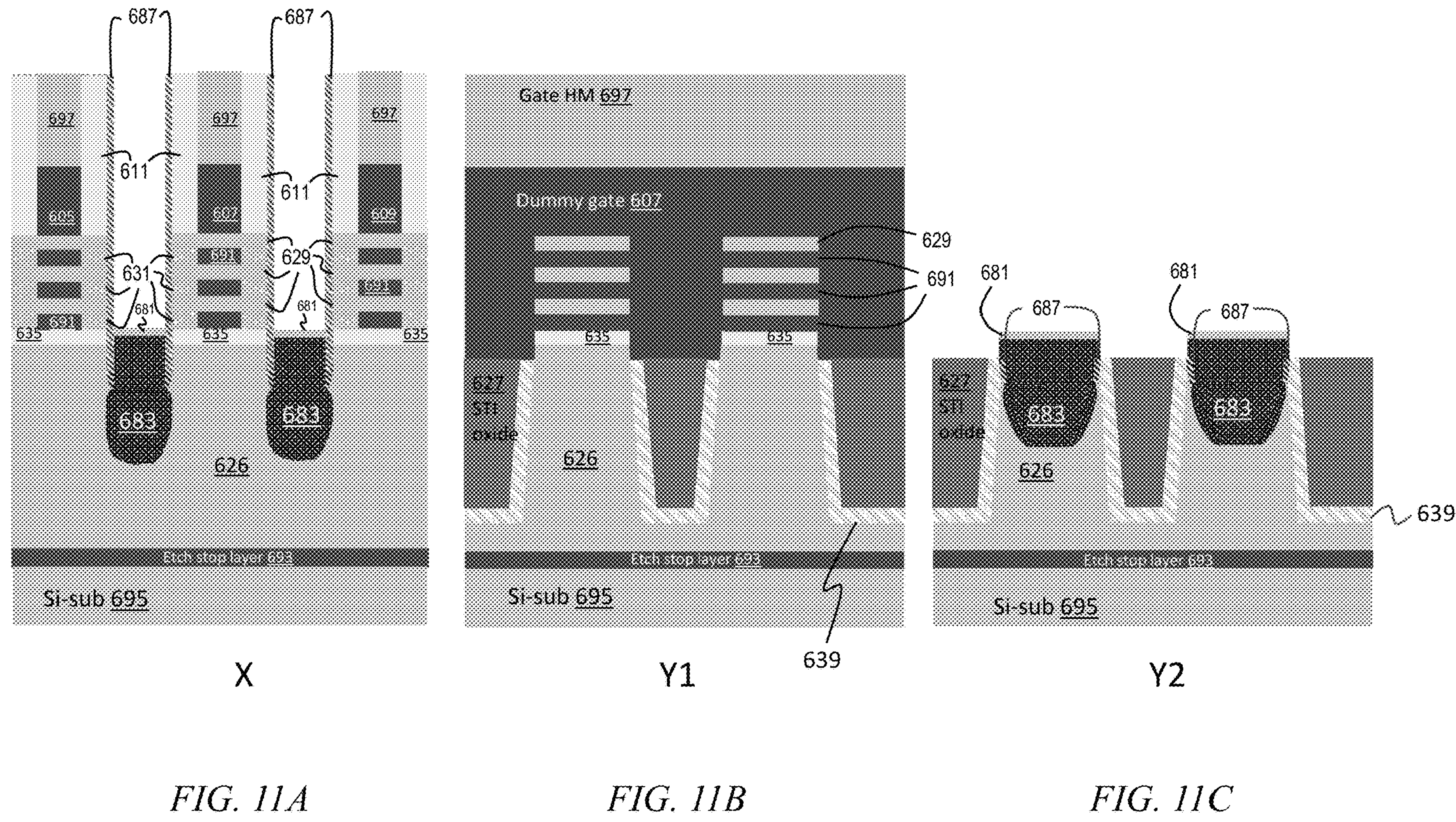
FIGS. 11A-11C are views of the semiconductor structure of FIGS. 10A-10C after placeholder epitaxial growth, taken along lines X1, Y1, and Y2, respectively of FIG. 6.

FIGS. 11A-11C show views corresponding to FIGS. 10A-10C, after epitaxially growing SiGe placeholders 683 with buffer silicon 681.

Figures 12A, 12B, 12C:
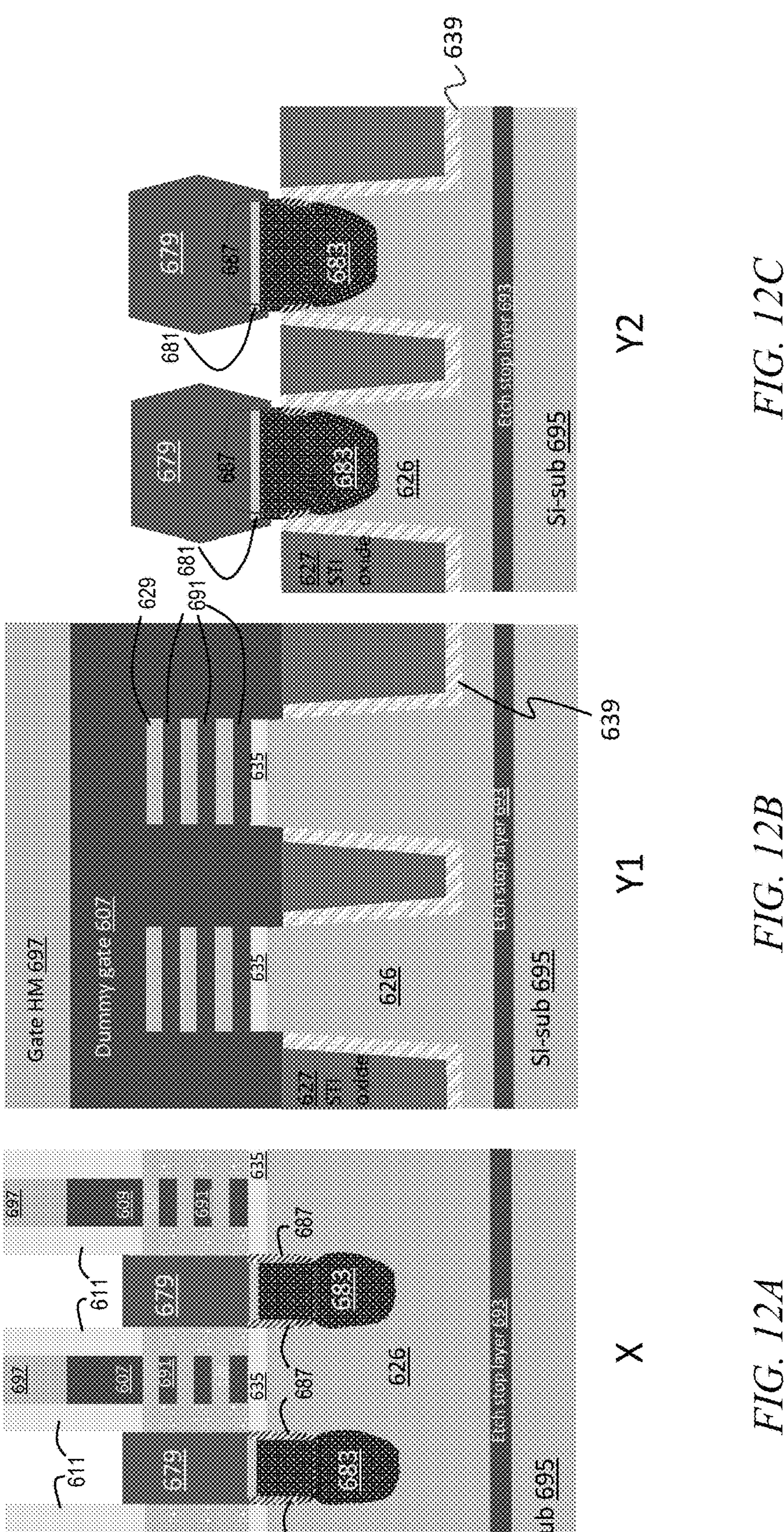
FIGS. 12A-12C are views of the semiconductor structure of FIGS. 11A-11C after CMOS source-drain epitaxial growth, taken along lines X1, Y1, and Y2, respectively of FIG. 6.

FIGS. 12A-12C show views corresponding to FIGS. 11A-11C, after epitaxially growing CMOS source-drain regions 679. As noted elsewhere herein, the nanosheets can be arranged, for example, as NNPPNNPP. Therefore, the view of FIG. 12C could include N next to P, P next to N, P next to P, or N next to N. In FIGS. 12A-12C, note also that the liner 687 was recessed as compared to FIGS. 11A-11C; i.e., in FIGS. 12A-12C, liner 687 is not present on the left/right hand side of source/drain epi 679. Note that the inner spacers 631 and buffer silicon 681 are not separately numbered in FIG. 12A to avoid clutter.

Figure 13:
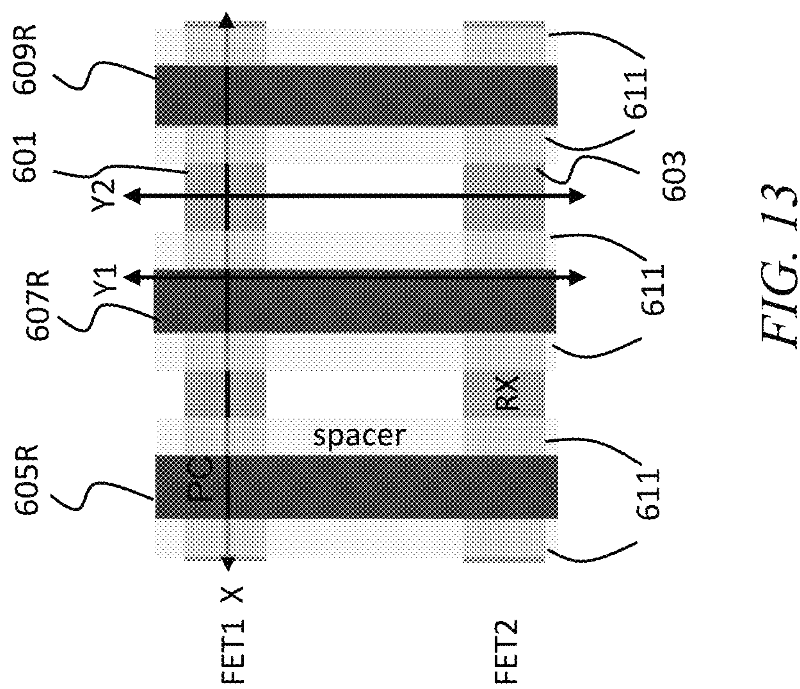
FIG. 13 is a top view of the semiconductor structure, in accordance with an aspect of the invention.

Further steps in the exemplary process flow are depicted beginning with FIG. 13, which is a top view of aspects of the continued fabrication process as shown in FIGS. 14A-21C. FIG. 13 is generally similar to FIG. 6 except that the gates are now replacement metal gates 605R, 607R, 609R and section line Y1 is moved near the right edge of gate 607R.

Figures 14A, 14B, 14C:
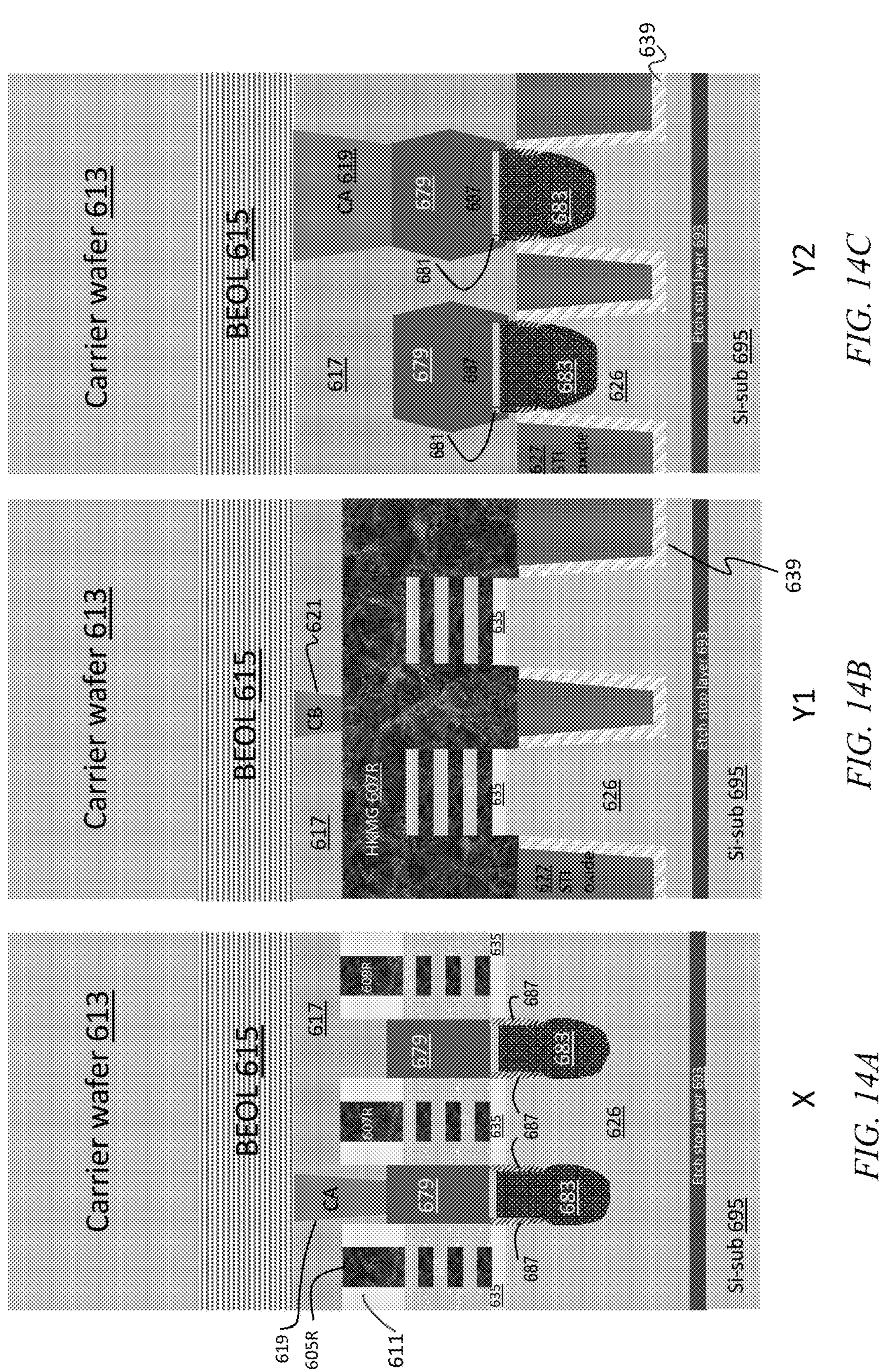
FIGS. 14A-14C are views of the semiconductor structure of FIGS. 12A-12C after replacement metal gate, middle of line, and back end of line processing, and bonding of a carrier wafer, taken along lines X1, Y1, and Y2, respectively of FIG. 13.

FIGS. 14A-14C show views corresponding to FIGS. 12A-11C, after poly-opening chemical-mechanical polishing (POC), carrying out the replacement metal gate (RMG) process, middle of line (MOL) processing, back end of line (BEOL) processing, and bonding to a carrier wafer. The skilled artisan will have general familiarity with techniques such as polysilicon (dummy) gate opening, polysilicon (dummy) gate pull, SiGe release, high-K metal gate (note HKMG 605R, 607R, 609R) formation, and deposition of topside interlayer dielectric (ILD) 617, MOL contact patterning (note source/drain contact 619, gate contact 621, BEOL 615, and bonding of a carrier wafer 613. The BEOL wiring 615 is depicted at a high level; the skilled person is familiar with the details of a BEOL wiring layer per se., and given the teachings herein, can implement BEOL wiring in connection with aspects of the invention.

Figures 15A, 15B, 15C:
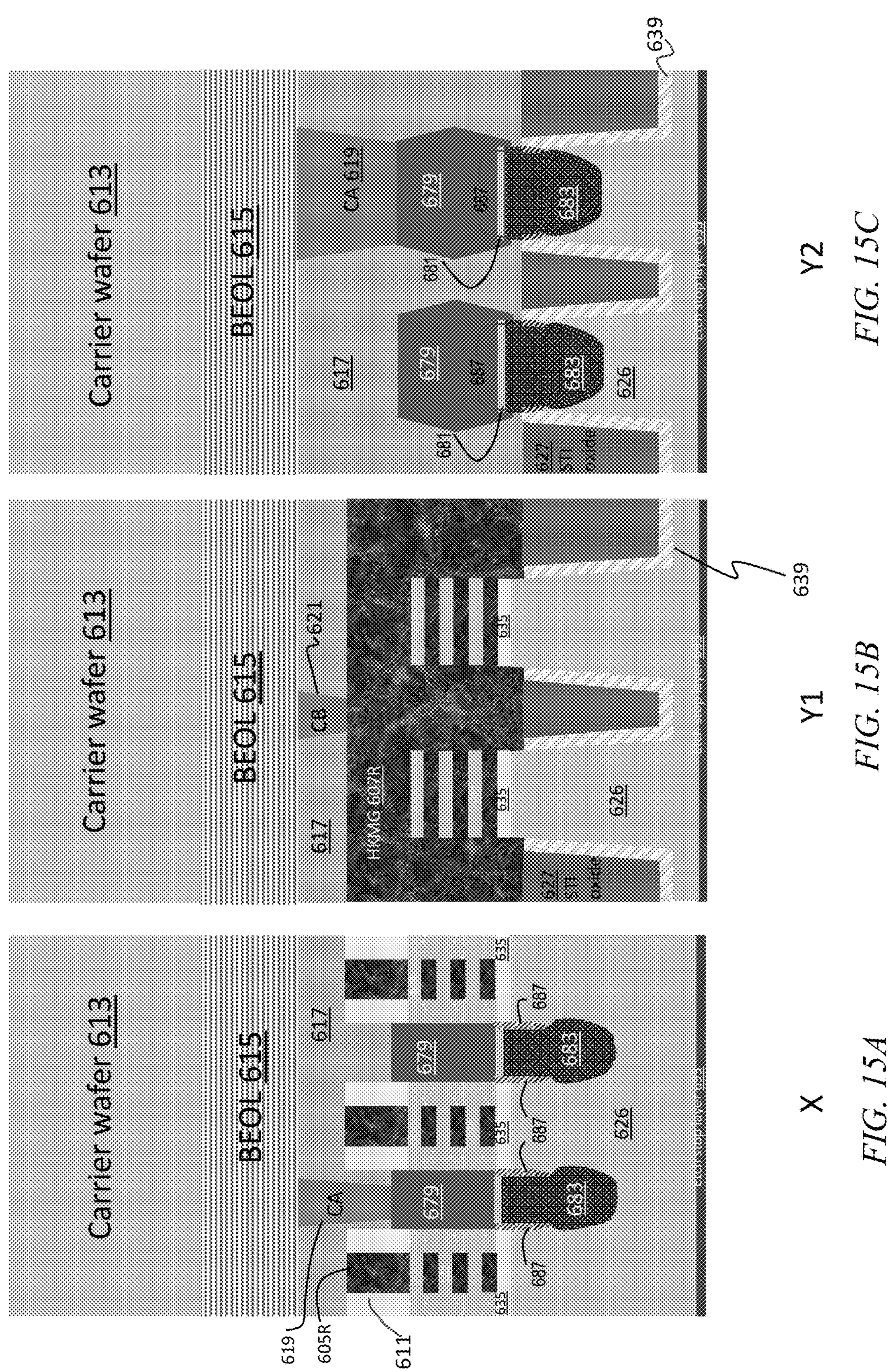
FIGS. 15A-15C are views of the semiconductor structure of FIGS. 14A-14C after wafer flipping and substrate removal, taken along lines X1, Y1, and Y2, respectively of FIG. 13.

FIGS. 15A-15C show views corresponding to FIGS. 14A-14C, after flipping the wafer and removal of the substrate, stopping on the SiGe etch stop layer (e.g., via grinding, chemical-mechanical polishing, and wet etching). Note that for illustrative convenience, FIGS. 15A-15C are depicted in the same orientation on the page as FIGS. 14A-14C; however, relative to a gravity vector, the structure has been flipped over.

FIGS. 16A-16C show views corresponding to FIGS. 15A-15C, after selectively removing the SiGe etch stop layer. After removal of the etch stop layer, the additional silicon substrate 626 is relatively flat.

Figures 17A, 17B, 17C:
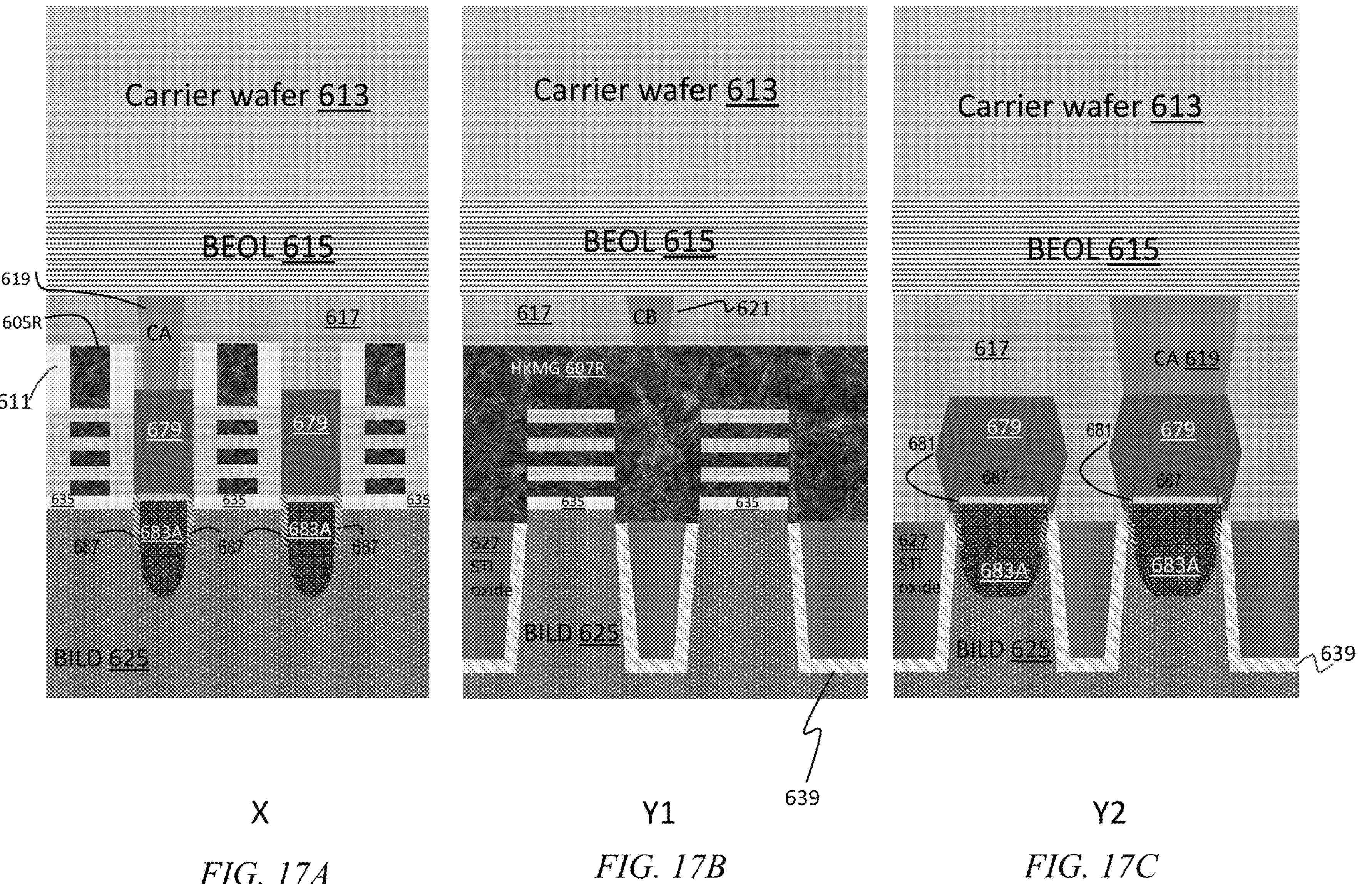
FIGS. 17A-17C are views of the semiconductor structure of FIGS. 16A-16C after additional silicon substrate removal 626, backside interlayer dielectric fill, and chemical-mechanical polishing, taken along lines X1, Y1, and Y2, respectively of FIG. 13.

FIGS. 17A-17C show views corresponding to FIGS. 16A-16C, after removing the remaining substrate via ammonia based wet etch, filling in backside ILD (BILD) 625 and planarizing the BILD 625 via chemical-mechanical polishing (CMP). The placeholders 683 shrink slightly because the etch is not perfectly selective to Si over SiGe; the shrunken placeholders are labeled as 683A. Upper portions of the placeholders are protected by the liner 687 and thus do not shrink.

Figures 18A, 18B, 18C:
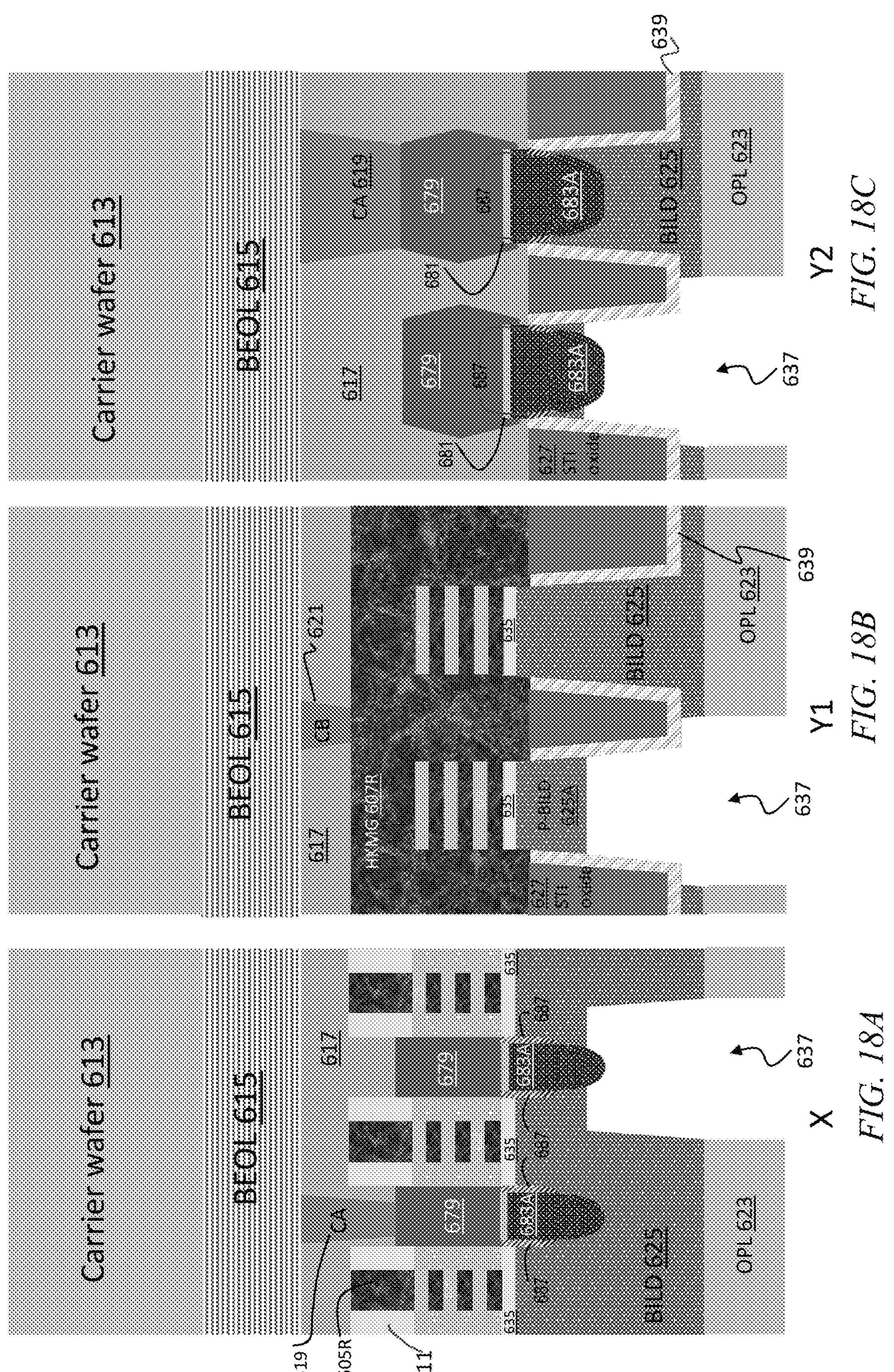
FIGS. 18A-18C are views of the semiconductor structure of FIGS. 17A-17C after backside contact patterning, taken along lines X1, Y1, and Y2, respectively of FIG. 13.

FIGS. 18A-18C show views corresponding to FIGS. 17A-17C, after depositing an organic planarization layer (OPL) 623 over the BILD 625 and patterning same for backside contacts yielding backside contact cavities 637 which are located adjacent source-drain regions 679 that are not opposite source/drain contacts 619. The skilled artisan will be familiar with suitable lithographic techniques. Note the "protector BILD" 625A which can exist because the liner 687 blocks the chemical used to remove the BILD there (between FIGS. 17B and 18B), and thus "protector BILD" 625A eventually remains and is covered by BSCA 673. The liner 687 and the "protector BILD" 625A are beneficial; the "protector BILD" 625A prevents the gate directly touching the S/D epitaxy.

Figures 19A, 19B, 19C:
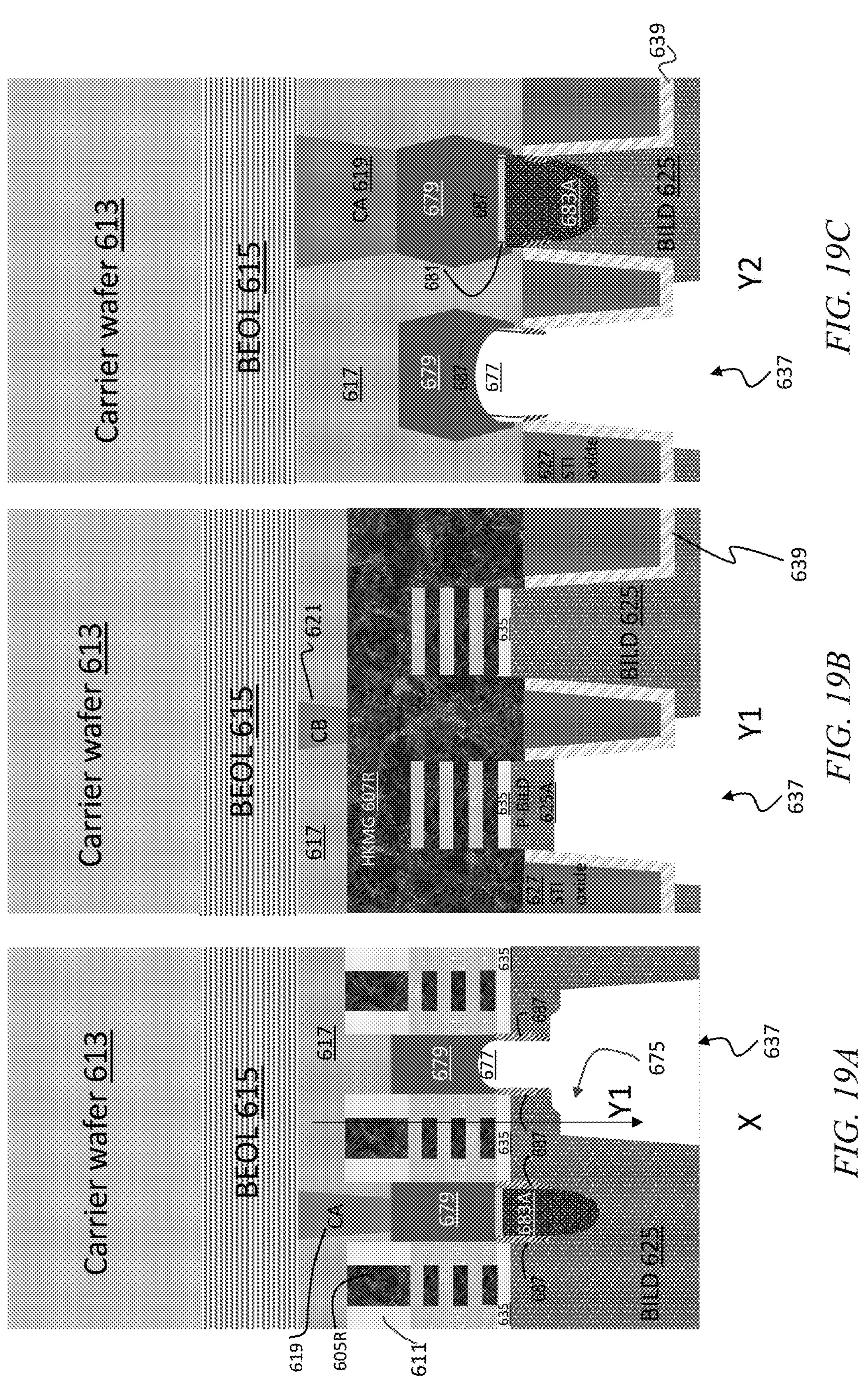
FIGS. 19A-19C are views of the semiconductor structure of FIGS. 18A-18C after placeholder removal, taken along lines X1, Y1, and Y2, respectively of FIG. 13.

FIGS. 19A-19C show views corresponding to FIGS. 18A-18C, after removal of those placeholders 683A in cavities 637. Also depicted is optional gouging 677 into the source-drain regions. As seen at 675, the BILD 625 recesses during the removal of the placeholders 683A and a shoulder forms; however, the liner 687 prevents shorts because it prevents the BILD 625 from recessing at the top of the cavities 637 in the region near the gate. Indeed, while the SiGe removal and pre-silicide cleaning processes can also etch the oxide of BILD 625, leading to an increase in the critical dimension of the contact cavities 637 (and thus of the resulting contacts), the SiN liner 687 anchors the critical dimension near the BDI 635, to prevent lateral contact size increase causing shorting to the gate.

Figures 20A, 20B, 20C:
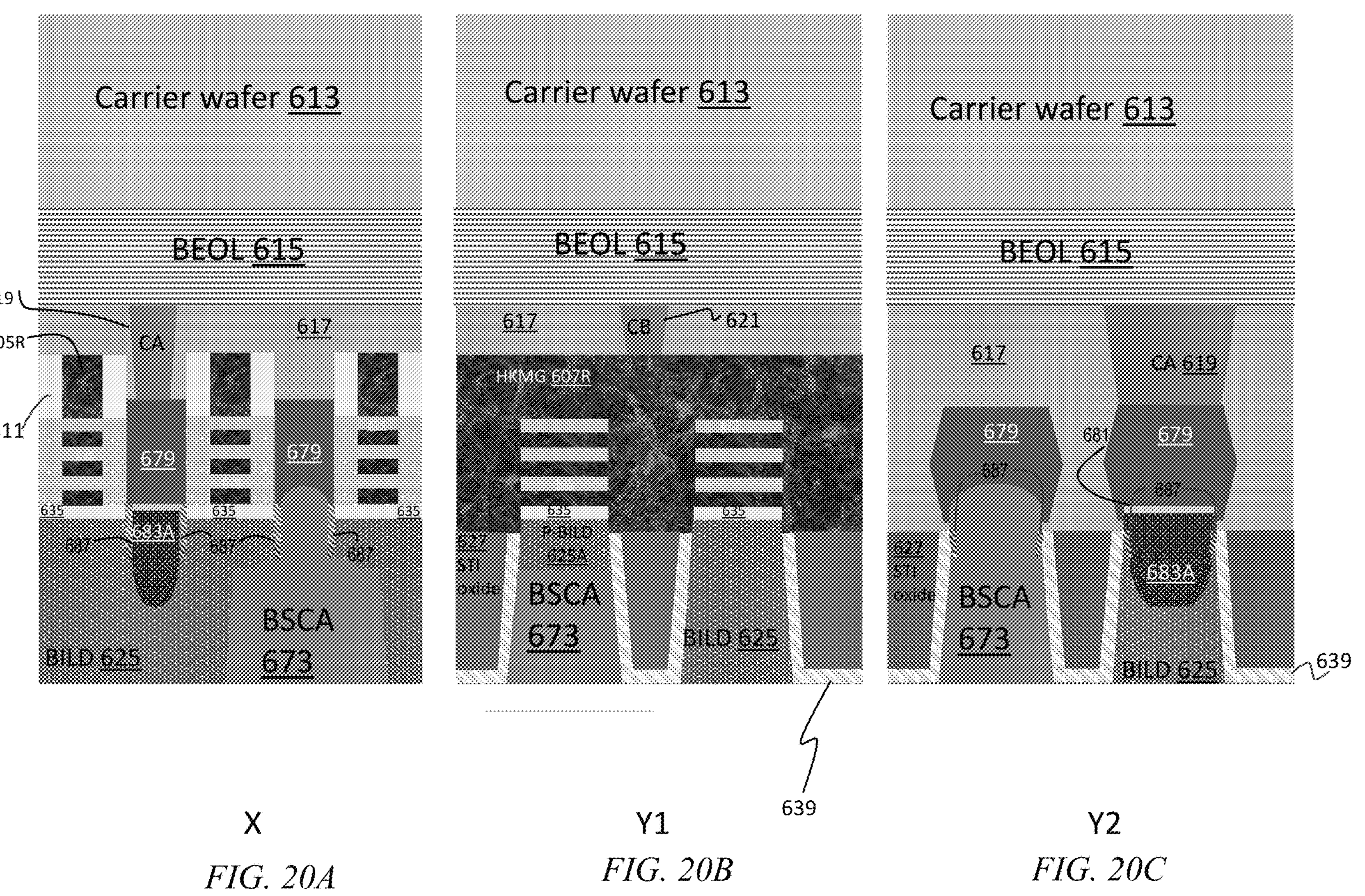
FIGS. 20A-20C are views of the semiconductor structure of FIGS. 19A-19C after backside contact metallization, taken along lines X1, Y1, and Y2, respectively of FIG. 13.

FIGS. 20A-20C show views corresponding to FIGS. 19A-19C, after backside contact metallization; note the resulting contacts 673.

Figures 21A, 21B, 21C:
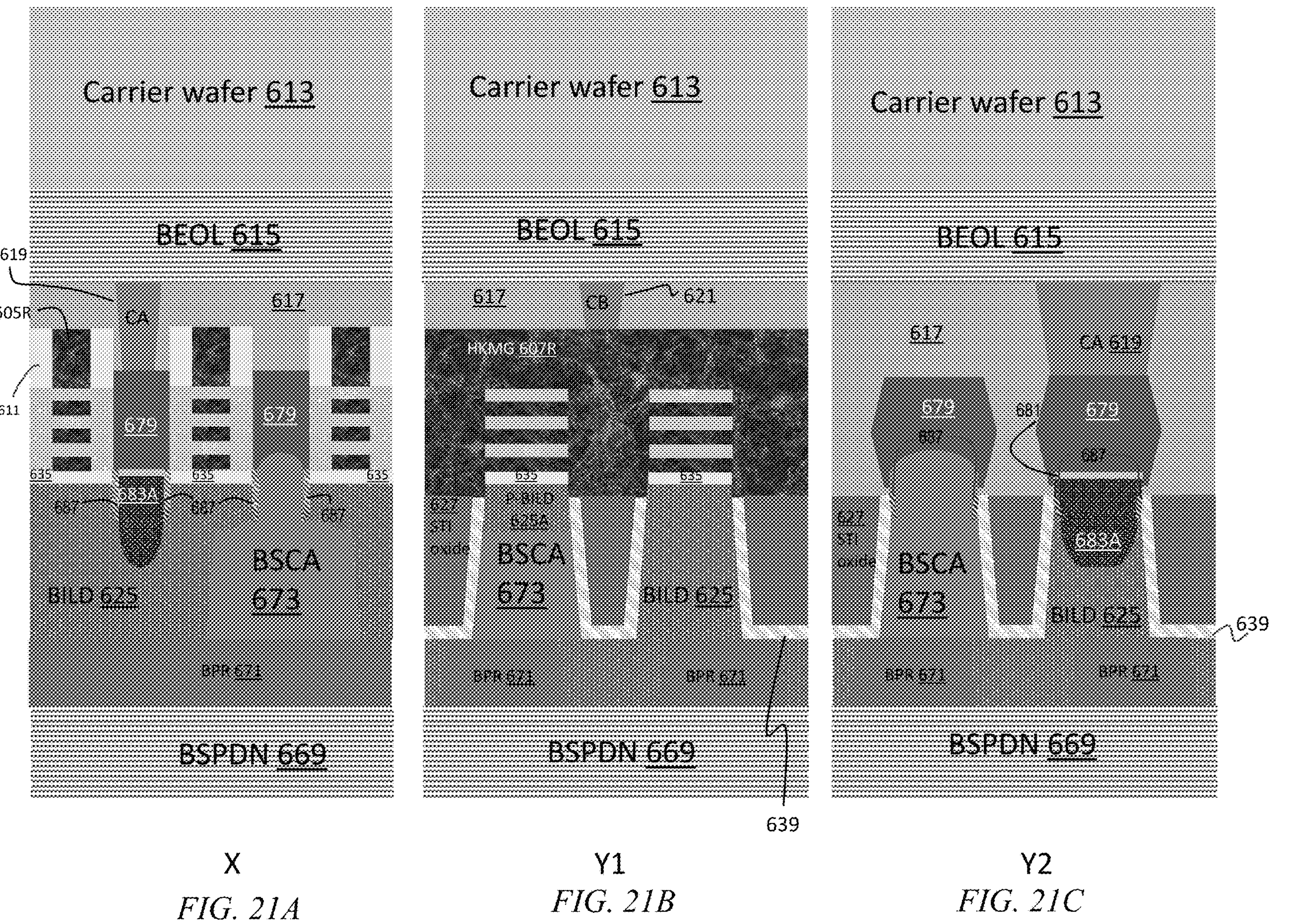
FIGS. 21A-21C are views of the semiconductor structure of FIGS. 20A-20C after buried power rail and backside power distribution network formation, taken along lines X1, Y1, and Y2, respectively of FIG. 13.

FIGS. 21A-21C show a final structure, views corresponding to FIGS. 19A-19C, after formation of buried power rails (BPR) 671 and a backside power distribution network (BSPDN) 669. The BSPDN 669 is depicted at a high level; the skilled person is familiar with the details of a BSPDN per se, and given the teachings herein, can implement a BSPDN in connection with aspects of the invention.

Figure 22:
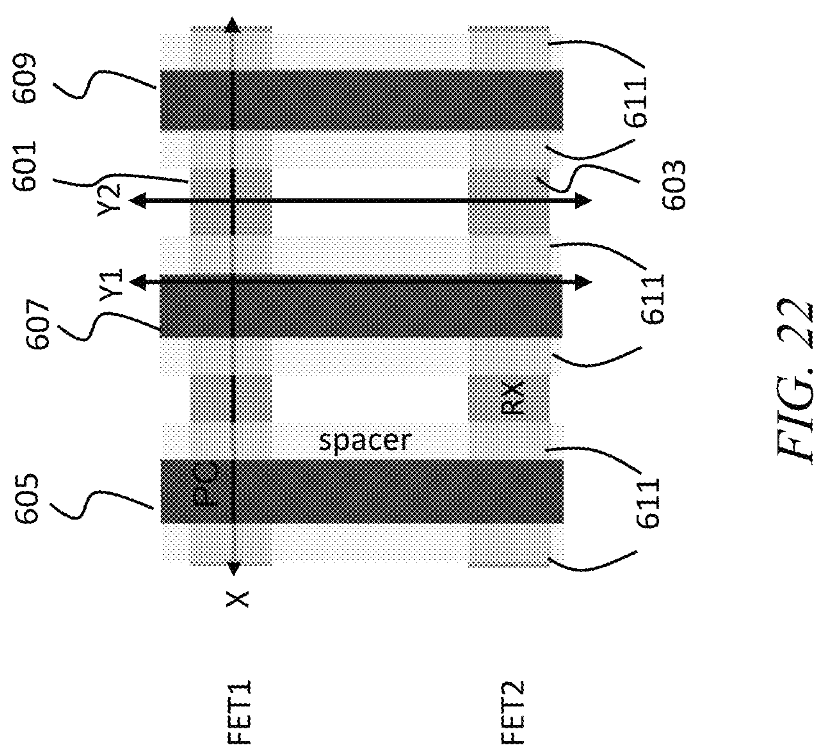
FIG. 22 is a top view of another semiconductor structure, in accordance with another aspect of the invention.
Figures 23A, 23B, 23C:
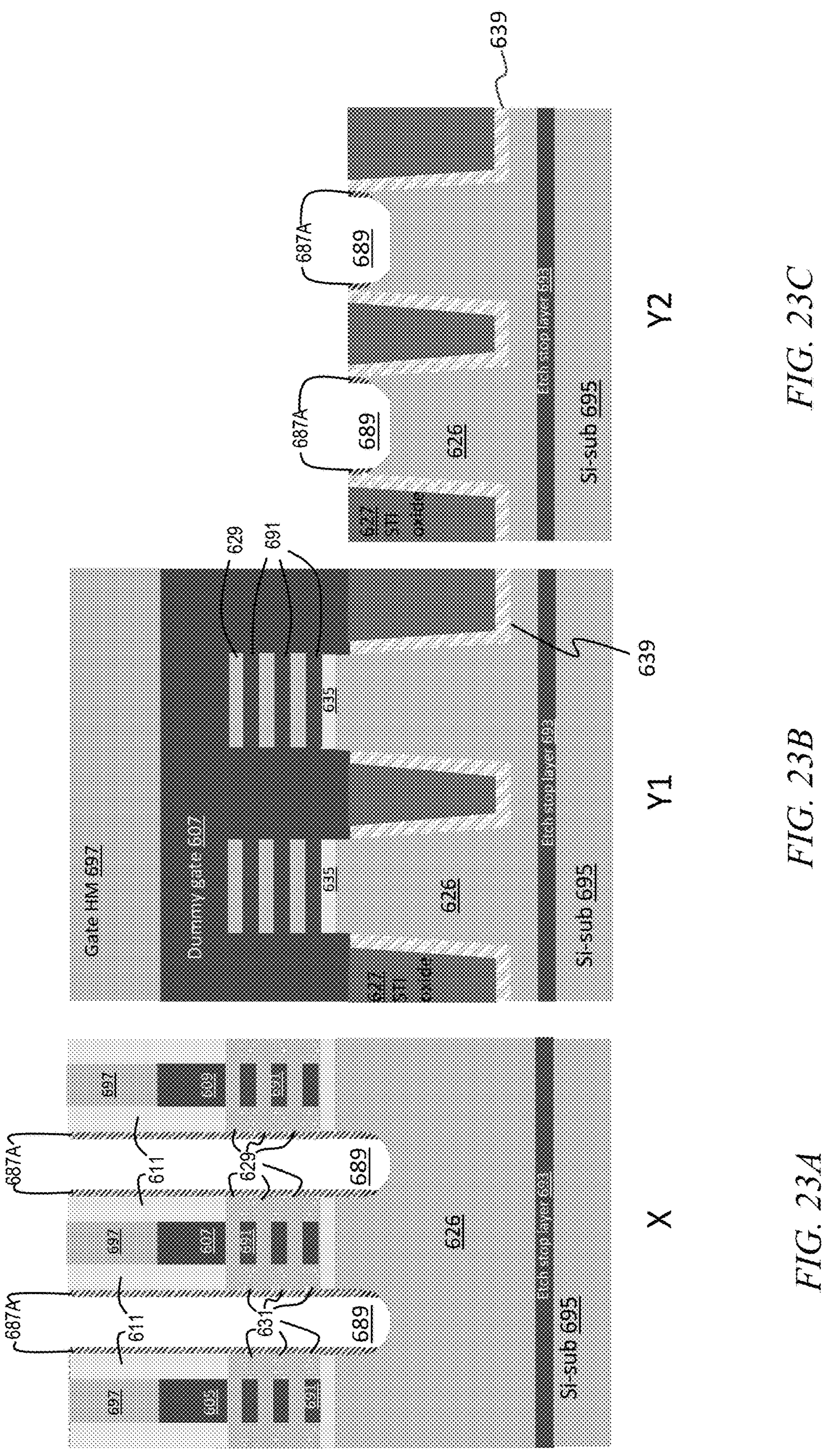
FIGS. 23A-23C are views of the semiconductor structure of FIG. 22, taken along lines X1, Y1, and Y2, respectively of FIG. 22.

Referring now to FIGS. 22 and 23A-23C, consider another exemplary process flow. FIG. 22 is a top view of aspects of an integrated circuit structure in accordance with another exemplary embodiment. FIG. 22 is similar to FIG. 13 except that the gates 605, 607, 609 are generally representative of both the dummy gates used during fabrication and the high-K metal gate stacks (HKMG) in the final structure. FIGS. 23A-23C are identical to FIGS. 9A-9C, except that the material of liners 687A is different than the material of the BDI or the inner spacer; for example, the material of liners 687A can be SiC, SiOC, AlOx, or the like. Aspects of the steps depicted at FIGS. 6-8C can also be used for this exemplary process flow, to obtain the starting structure of FIGS. 23A-23C, as will be apparent to the skilled artisan, in light of the teachings herein.

FIG. 23A is a cross-gate view of the device of FIG. 22 along line X in FIG. 22 while FIG. 23B is a cross-fin view of the device of FIG. 22 along line Y1 and FIG. 23C is a cross-fin view of the device of FIG. 22 between gates 607 and 609 (i.e., in S/D region) along line Y2. In FIGS. 23A-23C, the gates 605, 607, 609 are dummy gates. Elements similar to those described elsewhere have received the same reference number and are not necessarily described again.

Figures 24A, 24B, 24C:
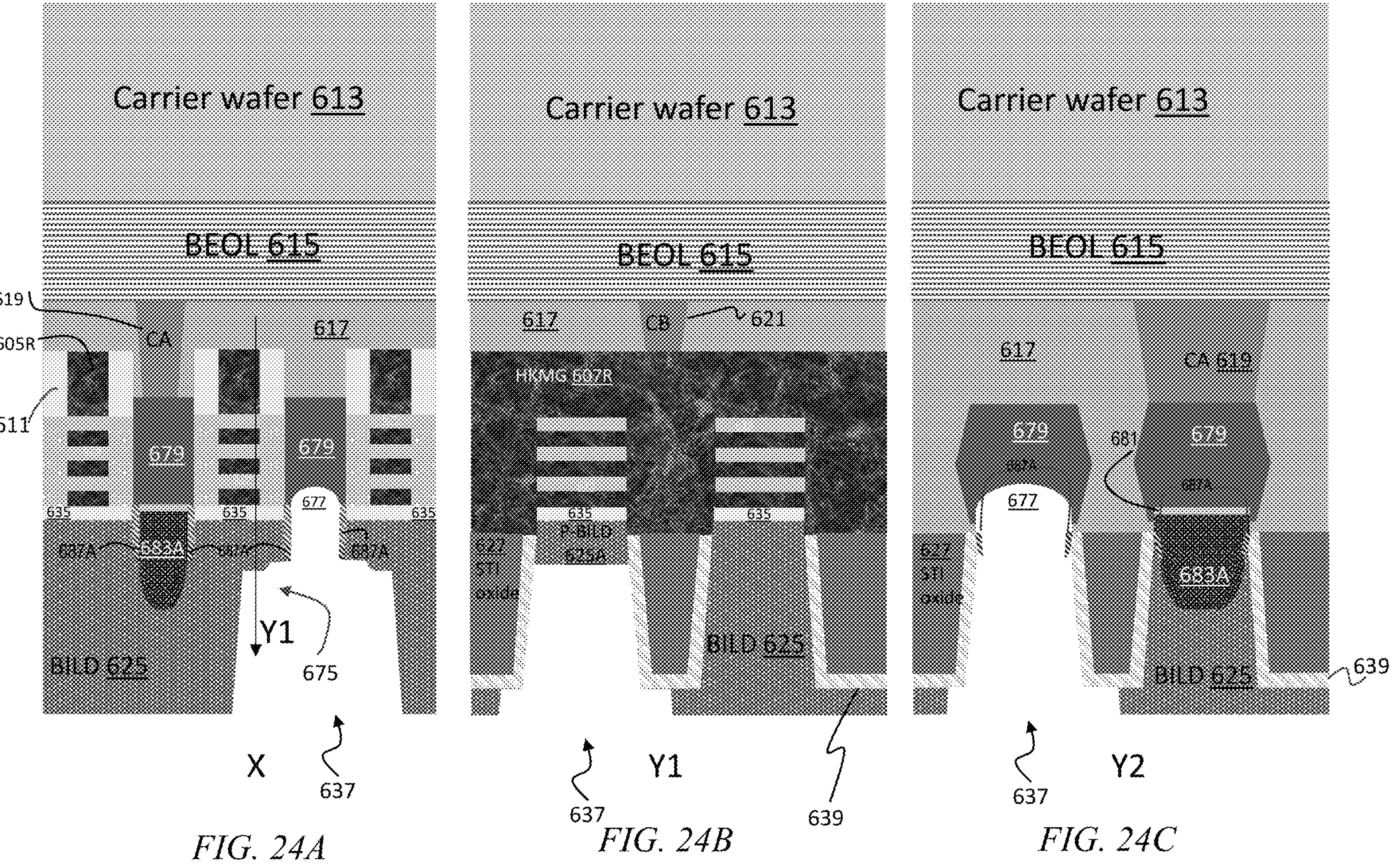
FIGS. 24A-24C are views of the semiconductor structure of FIGS. 23A-23C after placeholder removal, taken along lines X1, Y1, and Y2, respectively of FIG. 22.

FIGS. 24A-24C show views corresponding to FIGS. 23A-23C, and similar to those of FIGS. 19A-19C, reached from the structure of FIGS. 23A-23C by processes similar to the processes of FIGS. 10A-18C, finally with placeholder removal and optional gouging 677 into the source-drain regions as shown. Again, while the SiGe removal and pre-silicide cleaning processes can also etch the oxide of BILD 625, leading to an increase in the critical dimension of the contact cavities 637 (and thus of the resulting contacts), the SiC or AlOx liner 687 anchors the critical dimension near the BDI 635, to prevent lateral contact size increase causing shorting to the gate.

Figures 25A, 25B, 25C:
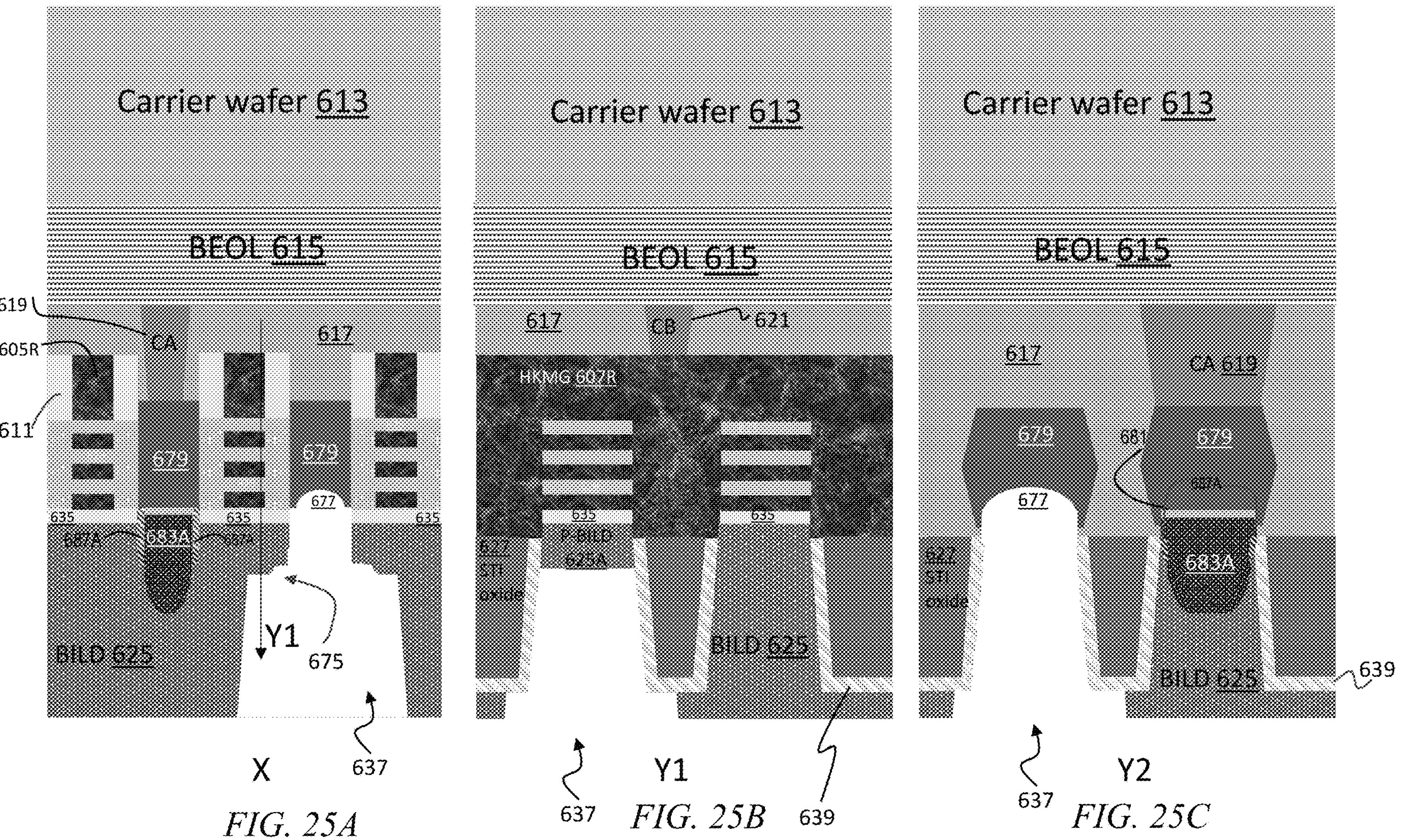
FIGS. 25A-25C are views of the semiconductor structure of FIGS. 24A-24C after selective liner removal, taken along lines X1, Y1, and Y2, respectively of FIG. 22.

FIGS. 25A-25C show views corresponding to FIGS. 24A-24C, after selective removal of the liner 687A in the contact cavities 637 (possible since in this example, the material of the liner 687A is different than that of the BDI 635, inner spacer 631, and BILD 625). Removal of the liner 687A slightly enlarges the sides of the contact cavities 637.

Figures 26A, 26B, 26C:
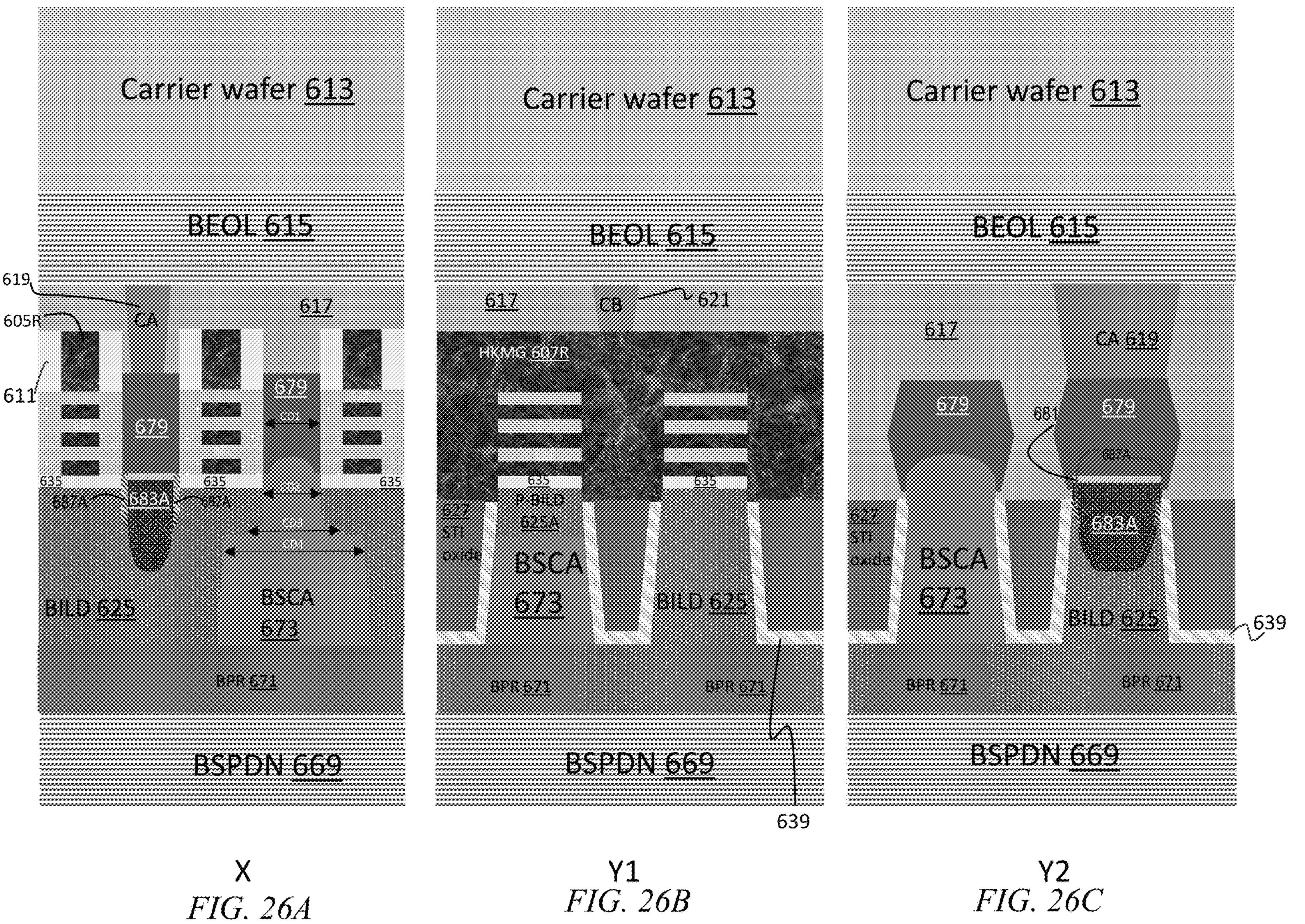
FIGS. 26A-26C are views of the semiconductor structure of FIGS. 25A-25C after subsequent processing steps, taken along lines X1, Y1, and Y2, respectively of FIG. 22.

FIGS. 26A-26C show a final structure, in views corresponding to FIGS. 25A-25C after metallization of the backside contacts 673, formation of buried power rails (BPR) 671 and a backside power distribution network (BSPDN) 669. The BSPDN 669 is depicted at a high level; the skilled person is familiar with the details of a BSPDN per se, and given the teachings herein, can implement a BSPDN in connection with aspects of the invention.

It will accordingly be appreciated that an exemplary fabrication process, according to an aspect of the invention, includes using conventional techniques, such those discussed elsewhere herein, to obtain a starting structure shown in FIGS. 7A-7C. Then, as shown in FIGS. 8A-8C, break through the BDI and etch shallow cavities; as shown in FIGS. 9A-9C, deposit liner and break through same; as shown in FIGS. 10A-10C, etch placeholder cavities with lateral enlargement; and, as shown in FIGS. 11A-11C, epitaxially grow SiGe placeholders with buffer silicon.

Further, as shown in FIGS. 12A-12C, epitaxially grow CMOS source-drain regions; as shown in FIGS. 14A-14C, carry out POC, the replacement metal gate (RMG) process, middle of line (MOL) processing, back end of line (BEOL) processing, and bonding to a carrier wafer; as shown in FIGS. 15A-15C, flip the wafer, and remove the substrate, stopping on the SiGe etch stop layer; as shown in FIGS. 16A-16C, selectively remove the etch stop layer; and, as shown in FIGS. 17A-17C, remove the remaining substrate by an ammonia-based wet etch, fill in BILD material, and carry out CMP.

Finally, as shown in FIGS. 18A-18C, carry out backside contact patterning; as shown in FIGS. 19A-19C, remove the placeholders that it is desired to remove with optional gouging into the source/drain regions; as shown in FIGS. 20A-20C, carry out metallization for the backside contacts; and, as shown in FIGS. 21A-21C, form the BPR and BPSDN.

Referring now to FIG. 13 and FIGS. 21A-21C, it will be appreciated that, in one aspect, an exemplary semiconductor structure includes a plurality of gate-all-around field effect transistors FET1, FET2, . . . . Each of the gate-all-around field effect transistors includes first and second source-drain regions 679; at least one channel region 629 interconnecting the first and second source-drain regions; and a gate structure 607R surrounding the at least one channel region. Also included is a direct backside contact 673 located below one of the first and second source-drain regions 679. The direct backside contact has an upper portion (not separately numbered; see, e.g., FIG. 21A. A dielectric liner 687 is wrapped around the upper portion of the direct backside contact.

One or more embodiments further include bottom dielectric isolation 635 below the gate structures and backside interlayer dielectric (BILD) 625 below the plurality of gate-all-around field effect transistors; a portion of the backside interlayer dielectric (BILD) 625 is protector backside interlayer dielectric (BILD) 625A located between a corresponding one of the gate structures 607R and the direct backside contact 673. The dielectric liner is between the upper portion of the direct backside contact and the BDI 635; see FIG. 21A.

In one or more embodiments, shallow trench isolation material 627 and a shallow trench isolation liner 639 are located below the plurality of gate-all-around field effect transistors, and the dielectric liner 687 is located between the shallow trench isolation liner 639 and the upper portion of the direct backside contact.

In some cases, the dielectric liner is a first dielectric liner, and the structure further includes a placeholder structure 683A located below another one of the first and second source-drain regions 679 as seen in FIG. 21A; and a second dielectric liner located between the backside interlayer dielectric (BILD) 625 and the (upper portion of) the placeholder 683A. "First" and "second" dielectric liners are terms of referential convenience; in one or more embodiments, the "first" and "second" liners are formed form the single deposition shown in FIGS. 9A-9C.

In one or more embodiments, as seen in FIG. 21C, the second dielectric liner is also located between the shallow trench isolation liner 639 and the placeholder 683A.

Some instances further include a buried power rail 671 below the direct backside contact and 673 in electrical contact therewith.

Some instances further include a backside power distribution network 669 below the buried power rail.

One or more embodiments further include a source-drain contact 619 above the another one of the first and second source-drain regions 679 and a gate contact 621 above the corresponding one of the gate structures 607R.

One or more embodiments further include a back-end-of-line wiring layer 615 upward from the source-drain contact and the gate contacts.

Referring now to FIG. 22 and FIGS. 26A-26C, it will be appreciated that, in another aspect, another exemplary semiconductor structure includes a plurality of gate-all-around field effect transistors FET1, FET2, . . . . Each of the gate-all-around field effect transistors includes first and second source-drain regions 679; at least one channel region 629 interconnecting the first and second source-drain regions; and a gate structure 607R surrounding the at least one channel region. A direct backside contact 673 is located below one of the first and second source-drain regions 679. The direct backside contact has an upper portion (not separately numbered; see, e.g., FIG. 26A). A placeholder structure is located below another one of the first and second source-drain regions. The placeholder structure has an upper portion. A dielectric liner is wrapped around the upper portion of the placeholder.

One or more embodiments further include backside interlayer dielectric (BILD) 625 below the plurality of gate-all-around field effect transistors. A portion of the backside interlayer dielectric (BILD) 625 is protector backside interlayer dielectric (P-BILD) 625A between a corresponding one of the gate structures 607R and the direct backside contact 673.

Some instances further include shallow trench isolation material 627 and a shallow trench isolation liner 639 located below the plurality of gate-all-around field effect transistors.

In some instances, the direct backside contact has an uppermost portion with a critical dimension CD2 that is substantially identical to (as used herein, less than 5% different from) a critical dimension CD1 of the one of the first and second source-drain regions (i.e., the one that is over the direct backside contact 673).

In one or more embodiments, the direct backside contact has an intermediate portion, below the uppermost portion, with a critical dimension CD3 that is larger than the critical dimension of the uppermost portion CD2.

In one or more embodiments, the direct backside contact has a lower portion, below the intermediate portion, with a critical dimension CD4 that is larger than the critical dimension of the intermediate portion CD3.

One or more embodiments further include a buried power rail 671 below the direct backside contact 673 and in electrical contact therewith, and backside power distribution network 669 below the buried power rail.

Some instances further include a source-drain contact 619 above the another one of the first and second source-drain regions 679 (i.e., the one over the placeholder 683A) and a gate contact 621 above the corresponding one of the gate structures 607R. A back-end-of-line wiring layer 615 is upward from the source-drain contact and the gate contacts.

In still another aspect, referring to FIGS. 7A-7C, an exemplary method of forming a semiconductor structure includes providing a starting structure including a silicon substrate 695, an etch stop liner 693 above the silicon substrate; and an additional silicon substrate 626 above the etch stop liner. The additional silicon substrate has a plurality of shallow trench isolation regions 627 formed therein. Bottom dielectric isolation (BDI) 635 is located above the additional silicon substrate. Dummy gate stacks (607 plus underlying layers) are above the bottom dielectric isolation (BDI) 635. The dummy gate stacks are separated by trenches.

Referring to FIGS. 8A-8C, another step includes etching through the bottom dielectric isolation (BDI) 635 at the bottoms of the trenches to form shallow cavities 689.

Referring to FIGS. 9A-9C, another step includes depositing liner material 687 on the sides of the trenches and the shallow cavities and removing the liner material from the bottom of the shallow cavities 689.

Referring to FIGS. 10A-10C, still another step includes etching placeholder cavities 685 at the bottom of the shallow cavities.

Referring to FIGS. 11A-11C, a further step includes growing placeholders 683 in the placeholder cavities.

Referring to FIGS. 12A-12C, still a further step includes epitaxially growing source-drain regions 679 outward of the placeholders (also removing portions of the liner material 687 as discussed elsewhere).

Referring to FIGS. 14A-14C and FIGS. 24A-24C, yet a further step includes forming replacement metal gates (e.g., 607R) between the source-drain regions, to replace the dummy gate stacks, forming middle-of-line contacts 619, 621, forming back-end-of-line wiring 615, and bonding to a carrier wafer 613 to obtain an intermediate structure.

One or more embodiments include flipping the intermediate structure and removing the substrate, etch stop liner, and additional silicon substrate 626, as seen, e.g., in FIGS. 15A-17C.

One or more embodiments include filling backside interlayer dielectric 625 and patterning same for backside contacts adjacent select ones of the placeholders, as seen, e.g., in FIGS. 18A-18C.

As seen, e.g., in FIGS. 19A-19C, remove select ones of the placeholders. and As seen, e.g., in FIGS. 20A-21C, metallize the backside contacts and form buried power rails (BPR) 671 and a backside power distribution network (BSPDN) 669.

Considering FIGS. 6-21C, one or more embodiments further include retaining the liner material 687 adjacent both the placeholders 683A and the backside contacts 673.

On the other hand, considering FIGS. 22-26C, one or more embodiments further include retaining the liner material 687A adjacent the placeholders 683A and removing the liner material adjacent the backside contacts 673.

Given the teachings herein, for any elements for which example materials are not set forth, the skilled artisan can select appropriate materials, and for any fabrication steps for which specific exemplary processes have not been set forth, the skilled artisan can select appropriate known processes. Exemplary known processes, in no particular order, include, for example, preparation (deposition/patterning) of nanosheet stacks with sacrificial SiGe regions, etch-back of sacrificial SiGe, formation of shallow trench isolation (STI), dummy gates including gate spacers, inner spacers, and BDI, dummy gate open, dummy gate removal, channel release, HKMG stack deposition, self-aligned contact (SAC) cap and trench metal contact formation, and with lithography, masks, and patterning, generally. The skilled artisan will be familiar with the "dummy gate" process for forming HKMGs. More generally, the skilled artisan will be familiar with epitaxial growth, self-aligned contact formation, formation of high-K metal gates, and so on. The term "high-K" has a definite meaning to the skilled artisan in the context of high-K metal gate (HKMG) stacks, and is not a mere relative term.

Bulk silicon is a non-limiting example of a suitable substrate material, other materials are also possible.

Semiconductor device manufacturing includes various steps of device patterning processes. For example, the manufacturing of a semiconductor chip may start with, for example, a plurality of CAD (computer aided design) generated device patterns, which is then followed by effort to replicate these device patterns in a substrate. The replication process may involve the use of various exposing techniques and a variety of subtractive (etching) and/or additive (deposition) material processing procedures. For example, in a photolithographic process, a layer of photo-resist material may first be applied on top of a substrate, and then be exposed selectively according to a pre-determined device pattern or patterns. Portions of the photo-resist that are exposed to light or other ionizing radiation (e.g., ultraviolet, electron beams, X-rays, etc.) may experience some changes in their solubility to certain solutions. The photo-resist may then be developed in a developer solution, thereby removing the non-irradiated (in a negative resist) or irradiated (in a positive resist) portions of the resist layer, to create a photo-resist pattern or photo-mask. The photo-resist pattern or photo-mask may subsequently be copied or transferred to the substrate underneath the photo-resist pattern.

There are numerous techniques used by those skilled in the art to remove material at various stages of creating a semiconductor structure. As used herein, these processes are referred to generically as "etching". For example, etching includes techniques of wet etching, dry etching, chemical oxide removal (COR) etching, and reactive ion etching (RIE), which are all known techniques to remove select material(s) when forming a semiconductor structure. The Standard Clean 1 (SC1) contains a strong base, typically ammonium hydroxide, and hydrogen peroxide. The SC2 contains a strong acid such as hydrochloric acid and hydrogen peroxide. The techniques and application of etching is well understood by those skilled in the art and, as such, a more detailed description of such processes is not presented herein.

Although the overall fabrication method and the structures formed thereby are novel, certain individual processing steps required to implement the method may utilize conventional semiconductor fabrication techniques and conventional semiconductor fabrication tooling. These techniques and tooling will already be familiar to one having ordinary skill in the relevant arts given the teachings herein. For example, the skilled artisan will be familiar with epitaxial growth, self-aligned contact formation, formation of high-K metal gates, and so on. The term "high-K" has a definite meaning to the skilled artisan in the context of high-K metal gate (HKMG) stacks, and is not a mere relative term. Moreover, one or more of the processing steps and tooling used to fabricate semiconductor devices are also described in a number of readily available publications, including, for example: James D. Plummer et al., *Silicon VLSI Technology: Fundamentals, Practice, and Modeling* 1*st* *Edition*, Prentice Hall, 2001 and P. H. Holloway et al., *Handbook of Compound Semiconductors: Growth, Processing, Characterization, and Devices*, Cambridge University Press, 2008, which are both hereby incorporated by reference herein. It is emphasized that while some individual processing steps are set forth herein, those steps are merely illustrative, and one skilled in the art may be familiar with several equally suitable alternatives that would be applicable.

It is to be appreciated that the various layers and/or regions shown in the accompanying figures may not be drawn to scale. Furthermore, one or more semiconductor layers of a type commonly used in such integrated circuit devices may not be explicitly shown in a given figure for ease of explanation. This does not imply that the semiconductor layer(s) not explicitly shown are omitted in the actual integrated circuit device.

Those skilled in the art will appreciate that the exemplary structures discussed above can be distributed in raw form (i.e., a single wafer having multiple unpackaged chips), as bare dies, in packaged form, or incorporated as parts of intermediate products or end products.

An integrated circuit in accordance with aspects of the present inventions can be employed in essentially any application and/or electronic system. Given the teachings of the present disclosure provided herein, one of ordinary skill in the art will be able to contemplate other implementations and applications of embodiments disclosed herein.

The illustrations of embodiments described herein are intended to provide a general understanding of the various embodiments, and they are not intended to serve as a complete description of all the elements and features of apparatus and systems that might make use of the circuits and techniques described herein. Many other embodiments will become apparent to those skilled in the art given the teachings herein; other embodiments are utilized and derived therefrom, such that structural and logical substitutions and changes can be made without departing from the scope of this disclosure. It should also be noted that, in some alternative implementations, some of the steps of the exemplary methods may occur out of the order noted in the figures. For example, two steps shown in succession may, in fact, be executed substantially concurrently, or certain steps may sometimes be executed in the reverse order, depending upon the functionality involved. The drawings are also merely representational and are not drawn to scale. Accordingly, the specification and drawings are to be regarded in an illustrative rather than a restrictive sense.

Embodiments are referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown; that is, this disclosure is intended to cover any and all adaptations or variations of various embodiments. Combinations of the above embodiments, and other embodiments not specifically described herein, will become apparent to those of skill in the art given the teachings herein.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "bottom", "top", "above", "over", "under" and "below" are used to indicate relative positioning of elements or structures to each other as opposed to relative elevation. If a layer of a structure is described herein as "over" another layer, it will be understood that there may or may not be intermediate elements or layers between the two specified layers. If a layer is described as "directly on" another layer, direct contact of the two layers is indicated. As the term is used herein and in the appended claims, "about" means within plus or minus ten percent.

The corresponding structures, materials, acts, and equivalents of any means or step-plus-function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit thereof. The embodiments were chosen and described in order to best explain principles and practical applications, and to enable others of ordinary skill in the art to understand the various embodiments with various modifications as are suited to the particular use contemplated.

The abstract is provided to comply with 37 C.F.R. § 1.76 (b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, the claimed subject matter may lie in less than all features of a single embodiment. Thus, the following claims are hereby incorporated into the Detailed Description, with each claim standing on its own as separately claimed subject matter.

Given the teachings provided herein, one of ordinary skill in the art will be able to contemplate other implementations and applications of the techniques and disclosed embodiments. Although illustrative embodiments have been described herein with reference to the accompanying drawings, it is to be understood that illustrative embodiments are not limited to those precise embodiments, and that various other changes and modifications are made therein by one skilled in the art without departing from the scope of the appended claims.

What is claimed is:

1. A semiconductor structure comprising:

a plurality of gate-all-around field effect transistors, each of the plurality of gate-all-around field effect transistors including:

a first source-drain region and a second source-drain region;

at least one channel region interconnecting the first source-drain region and the second source-drain region; and a gate structure surrounding the at least one channel region;

a direct backside contact located below one of the first source-drain region and the second source-drain region, the direct backside contact having an upper portion;

a dielectric liner wrapped around the upper portion of the direct backside contact; and a backside interlayer dielectric (BILD) below the plurality of gate-all-around field effect transistors, wherein a portion of the BILD comprises a protector BILD between the gate structure and the direct backside contact.

2. The semiconductor structure of claim 1, further comprising:

bottom dielectric isolation (BDI) below the gate structure, wherein the dielectric liner is between the upper portion of the direct backside contact and the BDI.

3. The semiconductor structure of claim 2, further comprising a shallow trench isolation material and a shallow trench isolation liner located below the plurality of gate-all-around field effect transistors, wherein the dielectric liner is located between the shallow trench isolation liner and the upper portion of the direct backside contact.

4. The semiconductor structure of claim 3, wherein the dielectric liner is a first dielectric liner, the semiconductor structure further comprises:

a placeholder structure located below another one of the first source-drain region and the second source-drain region; and a second dielectric liner located between the BILD and the placeholder.

5. The semiconductor structure of claim 4, wherein the second dielectric liner is located between the shallow trench isolation liner and the placeholder.

6. The semiconductor structure of claim 5, further comprising a buried power rail below the direct backside contact and in electrical contact therewith.

7. The semiconductor structure of claim 6, further comprising a backside power distribution network below the buried power rail.

8. The semiconductor structure of claim 7, further comprising a source-drain contact above the another one of the first source-drain region and the second source-drain region and a gate contact above the gate structure.

9. The semiconductor structure of claim 8, further comprising a back-end-of-line wiring layer upward from the source-drain contact and the gate contact.

10. A semiconductor structure comprising:

a plurality of gate-all-around field effect transistors, each of the plurality of gate-all-around field effect transistors including:

a first source-drain region and a second source-drain region;

at least one channel region interconnecting the first source-drain region and the second source-drain region; and a gate structure surrounding the at least one channel region;

a direct backside contact located below one of the first source-drain region and the second source-drain region, the direct backside contact having an upper portion;

a placeholder structure located below another one of the first source-drain region and the second source-drain region, the placeholder structure having an upper portion;

a dielectric liner wrapped around the upper portion of the placeholder structure; and a backside interlayer dielectric (BILD) below the plurality of gate-all-around field effect transistors, wherein a portion of the BILD comprises a protector BILD between the gate structure and the direct backside contact.

11. The semiconductor structure of claim 10, further comprising a shallow trench isolation material and a shallow trench isolation liner located below the plurality of gate-all-around field effect transistors.

12. The semiconductor structure of claim 11, wherein the direct backside contact has an uppermost portion with a critical dimension that is substantially identical to a critical dimension of one of the first source-drain region and the second source-drain region.

13. The semiconductor structure of claim 12, wherein the direct backside contact has an intermediate portion, below the uppermost portion, with a critical dimension that is larger than the critical dimension of the uppermost portion.

14. The semiconductor structure of claim 13, wherein the direct backside contact has a lower portion, below the intermediate portion, with a critical dimension that is larger than the critical dimension of the intermediate portion.

15. The semiconductor structure of claim 14, further comprising:

a buried power rail below the direct backside contact and in electrical contact therewith; and a backside power distribution network below the buried power rail.

16. The semiconductor structure of claim 15, further comprising:

a source-drain contact above the another one of the first source-drain region and the second source-drain region and a gate contact above the gate structure; and a back-end-of-line wiring layer upward from the source-drain contact and the gate contact.

* * * * *